United States Patent
Mochida

(10) Patent No.: US 8,737,150 B2
(45) Date of Patent: May 27, 2014

(54) SEMICONDUCTOR DEVICE AND PRODUCTION METHOD THEREOF

(76) Inventor: Yoko Mochida, Tokyo (JP)

( * ) Notice: Subject to any disclaimer, the term of this patent is extended or adjusted under 35 U.S.C. 154(b) by 107 days.

(21) Appl. No.: 13/407,668

(22) Filed: Feb. 28, 2012

(65) Prior Publication Data

US 2012/0224433 A1 Sep. 6, 2012

(30) Foreign Application Priority Data

| Mar. 1, 2011 | (JP) | 2011-044190 |
| Dec. 20, 2011 | (JP) | 2011-278125 |
| Jan. 30, 2012 | (JP) | 2012-016104 |

(51) Int. Cl.
*G11C 29/00* (2006.01)

(52) U.S. Cl.
USPC .......................... 365/201; 365/207

(58) Field of Classification Search
USPC ....................... 365/201, 207, 225.7
See application file for complete search history.

(56) References Cited

U.S. PATENT DOCUMENTS 6,424,142 B1 * 7/2002 Kato et al. ................. 324/750.3
6,903,976 B2 6/2005 Kawagoe et al.

FOREIGN PATENT DOCUMENTS

| JP | 2004-227710 A | 8/2004 |
| JP | 2009-104694 A | 5/2009 |

* cited by examiner

*Primary Examiner* — Huan Hoang
(74) *Attorney, Agent, or Firm* — McGinn IP Law Group, PLLC

(57) ABSTRACT

A semiconductor device includes a differential circuit and a power supply circuit that provides a power supply to the differential circuit. Current to be supplied to the differential circuit by the power supply circuit is controlled, based on logics of a burn-in mode signal and an activation control signal for the differential circuit.

25 Claims, 18 Drawing Sheets

ACTUAL MEASUREMENT RESULTS OF CURRENT CONSUMPTION OF PRODUCT A IN BURN-IN APPARATUS

| Vt(Nch/Pch) | TYP | LL | HL | LH | HH | [mA] |
|---|---|---|---|---|---|---|
| ACTUAL MEASURED VALUE | 59.38 | 81.64 | 64.77 | 38.98 | NOT MEASURED | |

ANALYSIS OF CURRENT CONSUMPTION IN BUNR-IN MODE

SEMICONDUCTOR DEVICE AND PRODUCTION METHOD THEREOF

REFERENCE TO RELATED APPLICATION

This application is based upon and claims the benefits of the priorities of Japanese patent application No. 2011-044190 filed on Mar. 1, 2011, Japanese patent application No. 2011-278125, filed on Dec. 20, 2011 and Japanese patent application No. 2012-016104 filed on Jan. 30, 2012, the disclosures of which are incorporated herein in their entirety by reference thereto. The present invention relates to a semiconductor device and a production method thereof. More specifically, the invention relates to a semiconductor device and a production method of the semiconductor device including a function of reducing power consumption during burn-in.

BACKGROUND

A failure of a semiconductor device may occur in one of an initial failure period, a chance failure period, and a wear failure period. These periods are determined according to a period of time from a start of use of the semiconductor device. In the initial failure period immediately after the use of the semiconductor device, an initial failure may frequently occur. In the chance failure period after an occurrence rate of the initial failure has reached a certain level and then has been stabilized, a failure may occur due to an accidental cause. In the wear failure period, a wear failure may frequently occur due to the end of the life of the semiconductor device as a product after the semiconductor device has continued to be used for a long period to time. It is known that, when failure occurrence rate is plotted along a vertical axis and time is plotted along a horizontal axis to create a graph, a so-called bathtub curve is obtained. That is, it can be seen that the failure occurrence rate is high in the initial failure period, the failure occurrence rate decreases in the chance failure period, and the failure occurrence rate increases again in the wear failure period.

Accordingly, when an initial failure is removed by screening before the start of use of the semiconductor device in order to reduce the failure occurrence rate of the semiconductor device, the failure occurrence rate can be reduced until the wear failure period starts. Burn-in is performed in a final production procedure of a semiconductor product, as a step of removing an initial failure by screening. This burn-in is a semiconductor device final production step where a semiconductor device, which has been initially determined to be a good product in a selection procedure of semiconductor devices, is operated in a state that is close to an actual use operation of the semiconductor device as much as possible under an environment of high power supply voltage and high temperature, thereby performing screening and aging. By performing a selection test again after this burn-in, the initial failure is removed. A final product not including the initial failure can be thereby shipped.

The burn-in is performed under the environment of high power supply voltage and high temperature in order to accelerate the screening. The higher a power supply voltage and a temperature are, the more effective it is to accelerate the screening. On the other hand, when the power supply voltage and the temperature are too high, the semiconductor device may be broken. Accordingly, the burn-in of the semiconductor device is performed under the environment of the power supply voltage and the temperature that are high as much as possible within a range that will not destroy the semiconductor device.

It is known that power consumption of the semiconductor device during burn-in may increase more than under a normal use condition of the semiconductor device because the burn-in is performed at high power supply voltage and at high temperature, as mentioned above. Patent Document 1 describes a semiconductor memory device (DRAM) capable of reducing power consumption that may increase during this burn-in. Patent Document 1 describes reduction of leak current in PMOS and NMOS transistors used for a sense amplifier differential circuit when the PMOS and NMOS transistors are turned off, during burn-in. Reduction of leak current is achieved by setting a substrate voltage of the PMOS transistor to be higher during the burn-in than during a normal operation and setting a substrate voltage of the NMOS transistor to be lower during the burn-in than during the normal operation. Patent Document 1 does not describe reduction of current consumption in the step of burn-in when the differential circuit is in an operation state.

Patent Document 2 describes a differential type input initial stage circuit that fetches a command/address supplied through an external terminal at high speed in a semiconductor memory device in compliance with DDR specifications, though not directly related to burn-in.

[Patent Document 1]
JP Patent Kokai Publication No. JP2004-2297710A, which corresponds to U.S. Pat. No. 6,903,976
[Patent Document 2]
JP Patent Kokai Publication No. JP2009-104694A

SUMMARY

The entire disclosures of Patent Documents 1 and 2 are incorporated herein by reference thereto. The following analysis is given by the present invention. When burn-in is performed under the environment of high power supply voltage and high temperature, consumption current that will flow through the differential circuit during operation of the differential circuit will also increase, in addition to the off-leak current described in Patent Document 1. In a common CMOS logic circuit, consumption current flows only when an input signal changes. In contrast therewith, in the differential circuit, it is necessary to cause bias current to constantly flow even if an input signal does not change. The magnitude of the bias current depends on performance such as a response speed demanded for the differential circuit. The bias current that must be constantly flown also increases in the differential circuit that needs to response to an input signal level change at high speed or a differential circuit for which a low output impedance is demanded, in particular. Further, in a semiconductor device in which consumption current varies to be large during normal use as well due to a variation in manufacturing condition of the semiconductor device, consumption current that will flow through the differential circuit during burn-in may greatly increase. This increase in the consumption current may become a hindrance to burn-in of a different semiconductor that is performed simultaneously with the burn-in of the semiconductor device.

According to a first aspect of the present invention, there is provided a semiconductor device including: a differential circuit; and a power supply circuit that provides a power supply to the differential circuit. Current to be supplied to the differential circuit by the power supply circuit is controlled, based on logics of a burn-in mode signal and an activation control signal of the differential circuit.

According to a second aspect of the present invention, there is provided a semiconductor device including a differential type input circuit and a test circuit. The differential type input circuit compares an external input signal and a reference voltage to output a result of the comparison to an inside of the semiconductor device. The test circuit includes an input circuit of a ratio type that outputs the external input signal to the inside of the semiconductor device at a time of a test in place of the differential type input circuit. The test circuit stops power supply to the differential type input circuit during the test.

According to a third aspect of the present invention, there is provided a production method of a semiconductor device including a differential circuit. The method includes testing whether or not current consumption of the semiconductor device before burn-in varies to be large and recording the variation of the current consumption of the semiconductor device to be large when the current consumption varies to be large. The method includes performing the burn-in by limiting current to be flown to the differential circuit when the record is referred to and then it is confirmed that the current consumption of the semiconductor device varies to be large.

According to the first and second aspects of the present invention, the current that will be supplied from the power supply circuit to the differential circuit can be limited during burn-in. Accordingly, flow of excessive consumption current through the semiconductor device during the burn-in can be limited.

In the semiconductor device including the differential circuit according to the third aspect of the present invention, it is tested before the burn-in whether or not the current consumption varies to be large and the burn-in can be performed by limiting the current that will flow through the differential circuit only for the semiconductor device whose current consumption varies to be large. Accordingly, excessive or insufficient execution of the burn-in will be avoided. Other features and/or advantageous of the present invention will become apparent from the entire disclosure including claims and drawings.

PREFERRED MODES

Figure 1:
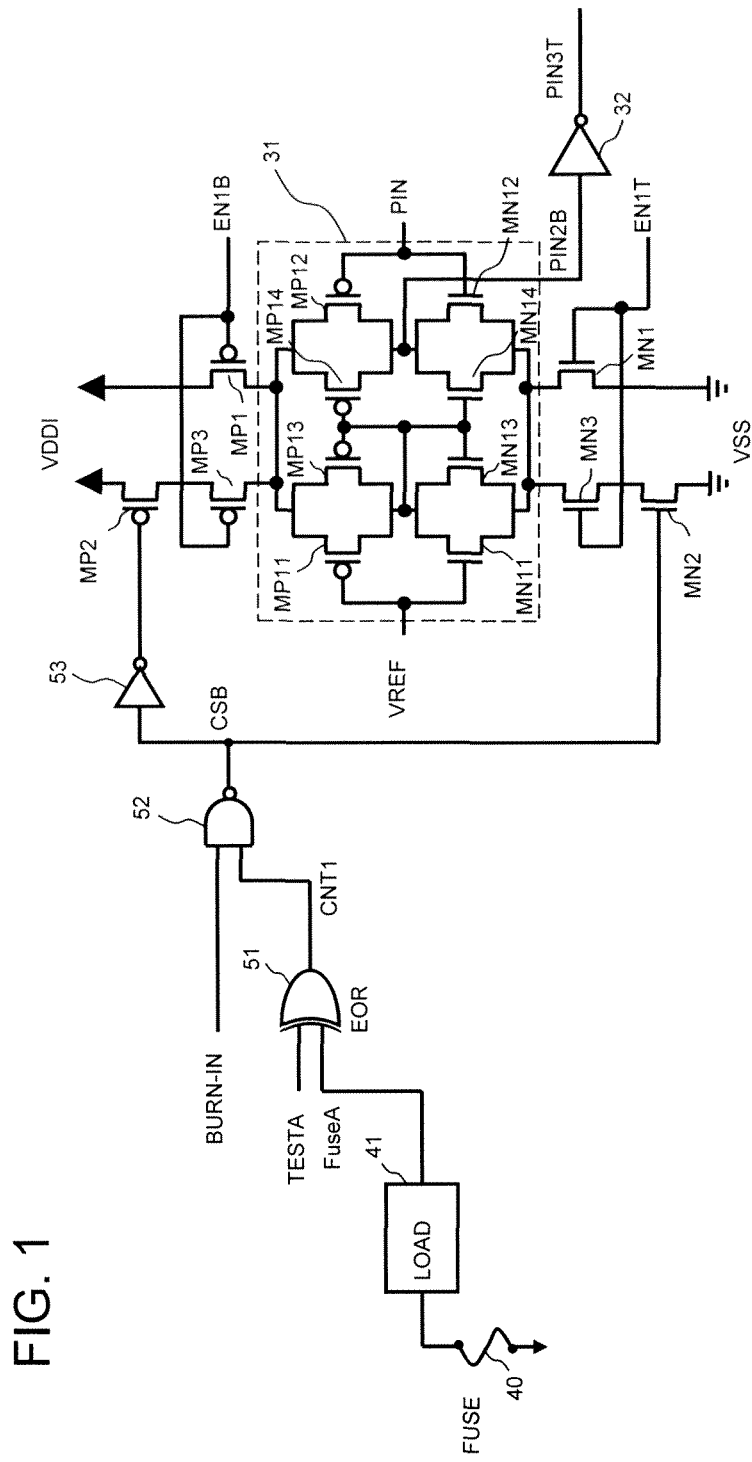
FIG. 1 is a block diagram of circuits in the vicinity of a QCR type input initial stage circuit in a semiconductor device in a first exemplary embodiment of the present invention.

An overview of exemplary embodiments of the present invention will be described. Reference characters for drawings given in description of the overview are exemplified for only facilitating understanding, and are not intended for limiting the invention to modes shown in the drawings.

As shown in FIG. 1, FIGS. 6 to 9, FIG. 14 and FIG. 15A, a semiconductor device of the present invention includes a differential circuit (21 or 31) and a power supply circuit (MP1 to MP3 and MN1 to MN3, or MP1, MN1, MP2a, and MN2a) that provides a power supply to the differential circuit. Based on logics of a burn-in mode signal (BURN-IN) and an activation control signal (EN1T, EN2T, or ENT) of the differential circuit, current to be supplied to the differential circuit by the power supply circuit is controlled. That is, not only the current to be supplied to the differential circuit is controlled based on the activation control signal, but also the current to be flown to the differential circuit can be further limited because the burn-in mode signal becomes active at a time of burn-in.

As shown in FIG. 1 and FIGS. 6 to 9, a current limitation circuit (51, 52 or 51, 56) receives the burn-in mode signal and a first control signal CNT1 and limits the current to be supplied to the differential circuit (21 or 31) by the power supply circuit (MP1 to MP3 and MN1 to MN3, or MP1, MN1, MP2a, and MN2a) when the burn-in mode signal and the first control signal CNT1 are both active. That is, the burn-in mode signal becomes active at the time of burn-in. Thus, when current consumption varies to be large, the current to be flown to the differential circuit can be limited by controlling the first control signal CNT1 to be active. Even in the burn-in mode, the current to be flown to the different circuit is not limited if the first control signal CNT1 is not made to be active. The current necessary for the burn-in can be flown to accelerate screening, without excessively reducing operating current during the burn-in.

Preferably, as shown in FIG. 1 and FIGS. 6 to 9, the power supply circuit includes a first power supply circuit MP1 and a second power supply circuit (MP2 to MP3 or MIP2a) connected to a first power source (VDDI or VPP), a third power supply circuit MN1, and a fourth power supply circuit (MN2 to MN3 or MN2a) connected to a second power source VSS. When the activation control signal (EN1T or EN2T) is at an inactive level, all of the first to fourth power supply circuits stop supply of powers to the differential circuit (21 or 31). Thus, the current to be flown to the differential circuit can be stopped. When the activation control signal (EN1T or EN2T) is at an active level and a current limitation signal CSB is inactive, the first and second power supply circuits supply the powers to the differential circuit in parallel from the first power source (VDDI or VPP). The third and fourth power supply circuits supply the powers to the differential circuit in parallel from the second power source VSS.

On the other hand, even if the activation control signal (EN1T or EN2T) is at the active level (high level), each of the second and fourth power supply circuits stops supply of the power to the differential circuit (21 or 31) when the current limitation signal CSB is active (low level), so that only each of the first and third power supply circuits can supply the power to the differential circuit. Accordingly, only when it is necessary to limit the current that will flow through the differential circuit, current limitation can be performed.

Further, as shown in FIG. 1, FIGS. 6 to 9, and FIG. 11, it is preferable that the current limitation circuit (51, 52 or 51, 56) include a non-volatile memory 40, a reading circuit 41 for the non-volatile memory, and a first combinational logic circuit 51 that combines a logic of the non-volatile memory read from the reading circuit and a test mode signal TESTA to generate the first control signal CNT1. With that arrangement, a test can be performed for the semiconductor device before the burn-in, and whether or not it is necessary to limit power consumption during the burn-in can be written into the non-volatile memory 40 in advance, based on a result of the test. Further, a logic of the first control signal CNT1 can be controlled based on the data in the non-volatile memory at a time of the burn-in, and current consumption during the burn-in can be reduced only if necessary. A fuse is a preferable example of the non-volatile memory. An exclusive-OR (EOR) circuit is a preferable example of the first combinational logic circuit 51.

Figure 11:
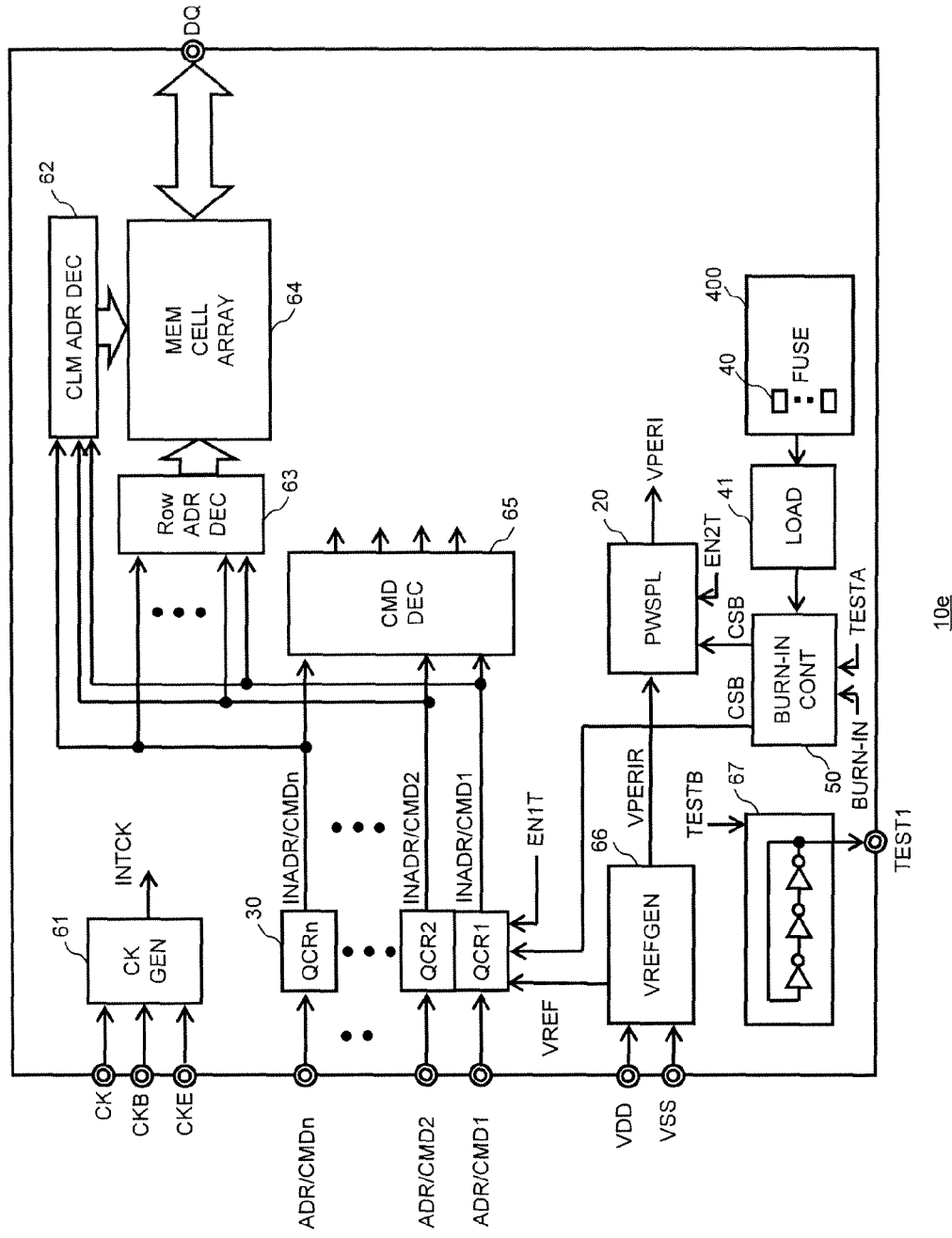
FIG. 11 is a block diagram of an entire semiconductor device in a fifth exemplary embodiment.

Assume that the semiconductor device includes various differential circuits (20, 30) as shown in FIG. 11. Then, current to be flown to each differential circuit is limited only when the limitation during burn-in is necessary.

Figure 14:
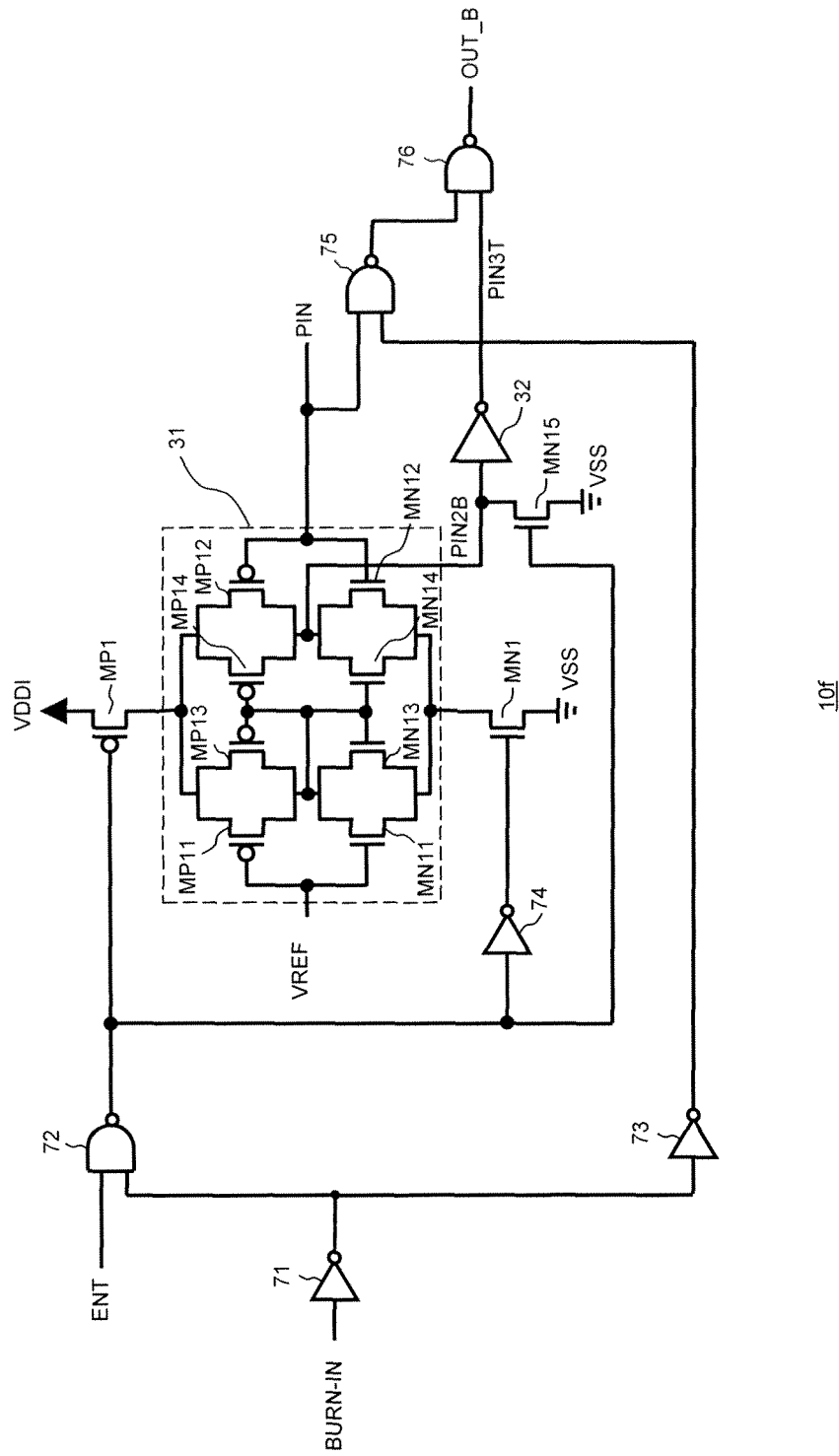
FIG. 14 is a block diagram of circuits in the vicinity of a QCR type input initial stage circuit in a semiconductor device in a seventh exemplary embodiment.
Figure 15A:
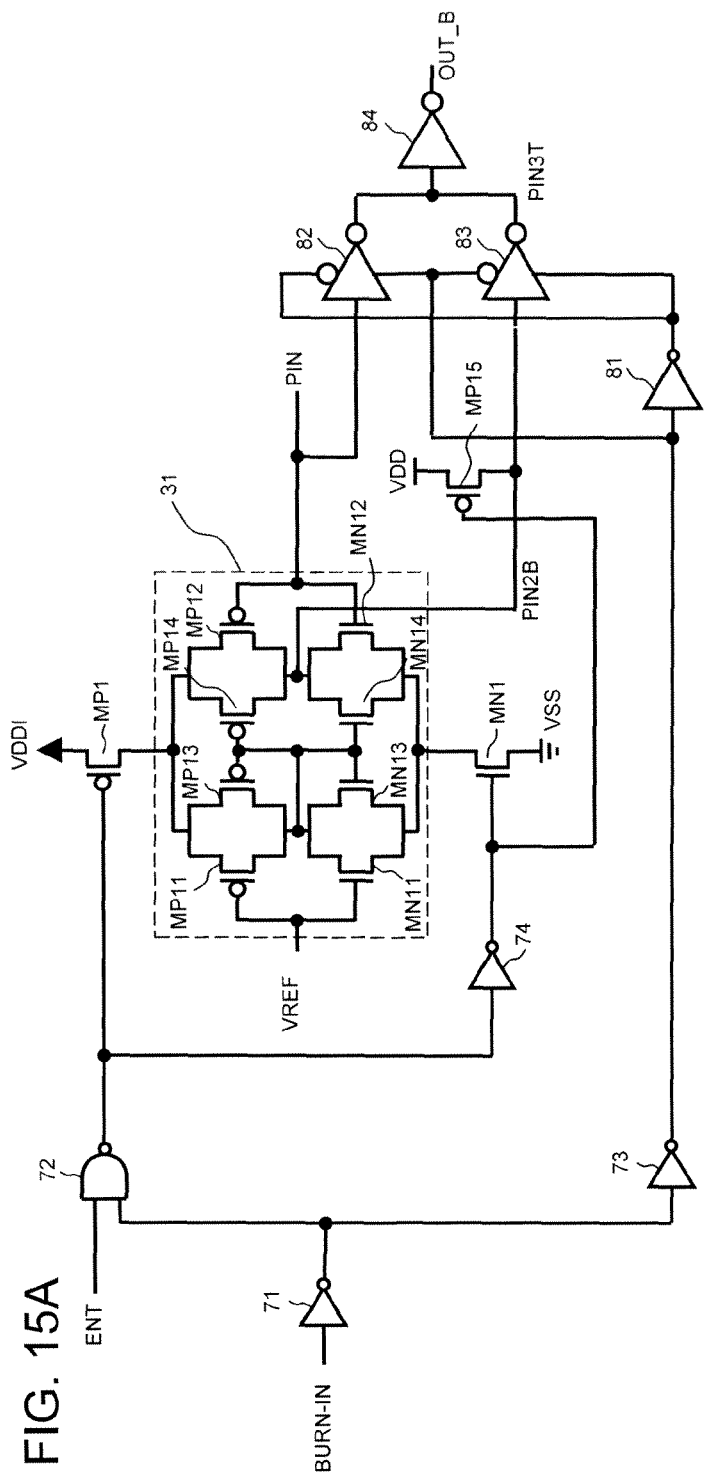
FIG. 15A is a block diagram showing circuits in the vicinity of a QCR type input initial stage circuit in a semiconductor device in an eighth exemplary embodiment.

Further, as shown in FIG. 14 and FIG. 15A, when a test circuit (71, 72, 73, 75, 76, 81-84, MN15, MP15, 32) carries out a test, power supply to the differential type input circuit (31) can be stopped. Then, in place of the differential type input circuit (31), a gate (75, 82), which a portion of the test circuit, is functioned as an input circuit of a ratio type whose operating point is determined by a transistor resistance ratio. An external input signal (PIN) can be taken in into an inside of the semiconductor device. The above is description of the overview.

[Supplementary Explanation of Problems of Related Arts]

Figure 2:
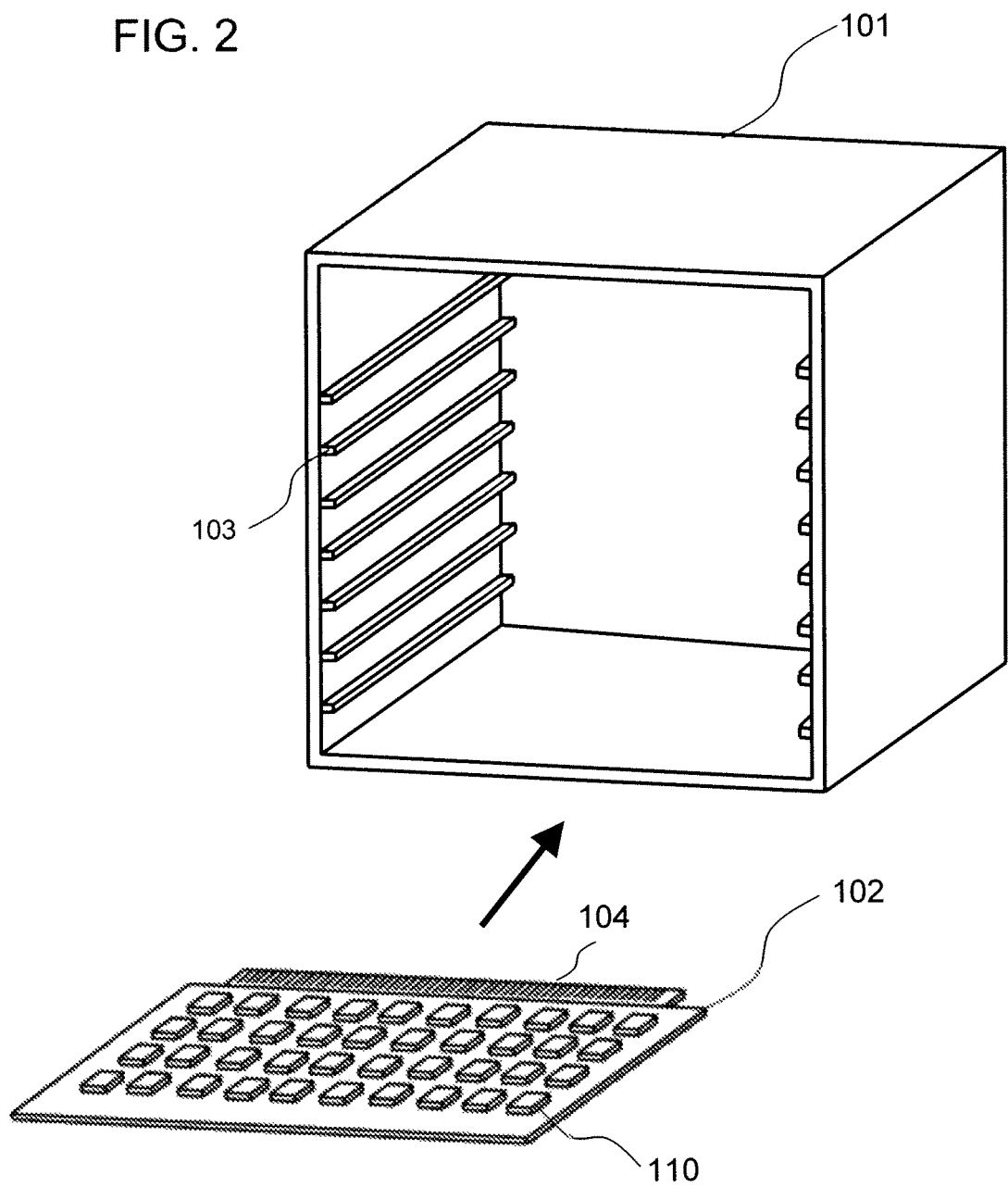
FIG. 2 is a schematic diagram showing a state of a burn-in board to be mounted in a burn-in apparatus and semiconductor devices (sockets)

Next, further supplementary explanation will be given about a problem of a related art before moving on to more specific description of exemplary embodiments of the present invention. FIG. 2 is a schematic diagram of a burn-in apparatus 101 and a burn-in board 102 used for burn-in of semiconductor devices. A plurality of sockets 110 for mounting the semiconductor devices are arranged on the burn-in board 102. When burn-in of the semiconductor devices is performed, the semiconductor devices are respectively mounted on the sockets 110 for mounting the semiconductor devices. The burn-in board 102 is mounted into each slot 103 of the burn-in apparatus 101. Power supplies, a clock signal, and other signals necessary for the burn-in are supplied from a power source of the burn-in apparatus 101 not shown to the semiconductor devices mounted on the sockets 110 through connection terminals 104 of the burn-in board 102.

Generally, during burn-in, current that is larger than that during normal use of a semiconductor device flows through the semiconductor device. Each of the burn-in apparatus 101 and the burn-in board 102 has limited current supply capability. When consumption current of the semiconductor device for which the burn-in is performed is too large, it becomes necessary to limit the number of the semiconductor devices to be mounted on the burn-in boards 102 and the number of the burn-in boards 102 to be connected to the burn-in apparatus 101. The burn-in therefore cannot be efficiently performed.

Figure 3:
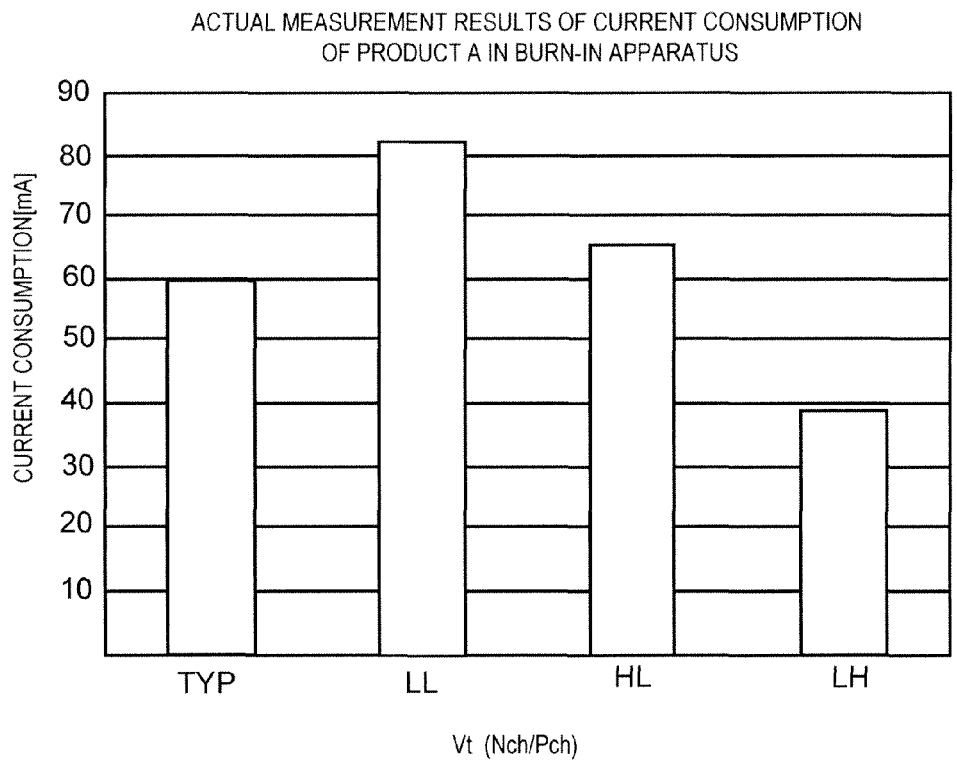
FIG. 3 includes a graph and a table showing threshold values of NMOS and PMOS transistors of semiconductor devices A and actual measurement results of current consumptions of the semiconductor devices A in the burn-in apparatus.

FIG. 3 includes a graph and a table showing actual measurement results of consumption currents of related-art products A each including a differential circuit in the burn-in apparatus. Measurements were performed for the products A mounted on the burn-in boards and a consumption current per each product A in the burn-in apparatus was obtained. The measurements were performed for the product As having NMOS and PMOS transistors with high, standard, and low threshold voltages. Referring to FIG. 3, TYP, LL, HL, and LH of Vt (Nch/Pch) respectively indicate the standard threshold NMOS transistors and the standard threshold PMOS transistors, the low threshold NMOS transistors and the low threshold PMOS transistors, the high threshold NMOS transistors and the low threshold PMOS transistors, and the low threshold NMOS transistors and the high threshold PMOS transistors. The measurement was omitted for the high threshold NMOS transistors and the high threshold PMOS transistors.

It was found, as shown in FIG. 3 that the current consumption of the product A including the low threshold NMOS transistors and the low threshold PMOS transistors (LL) is the largest. It was found that, among the products A for which the measurements were made, the current consumption of the product A including the low threshold NMOS transistors and the high threshold PMOS transistors is the smallest and that there was a correlation between the threshold values of the transistors and current consumption during burn-in. Accordingly, it can be seen that, based on a measurement result of an item which depends on the thresholds of the transistors in a test process before the burn-in, current consumption of the product during the burn-in can be predicted.

Figure 4:
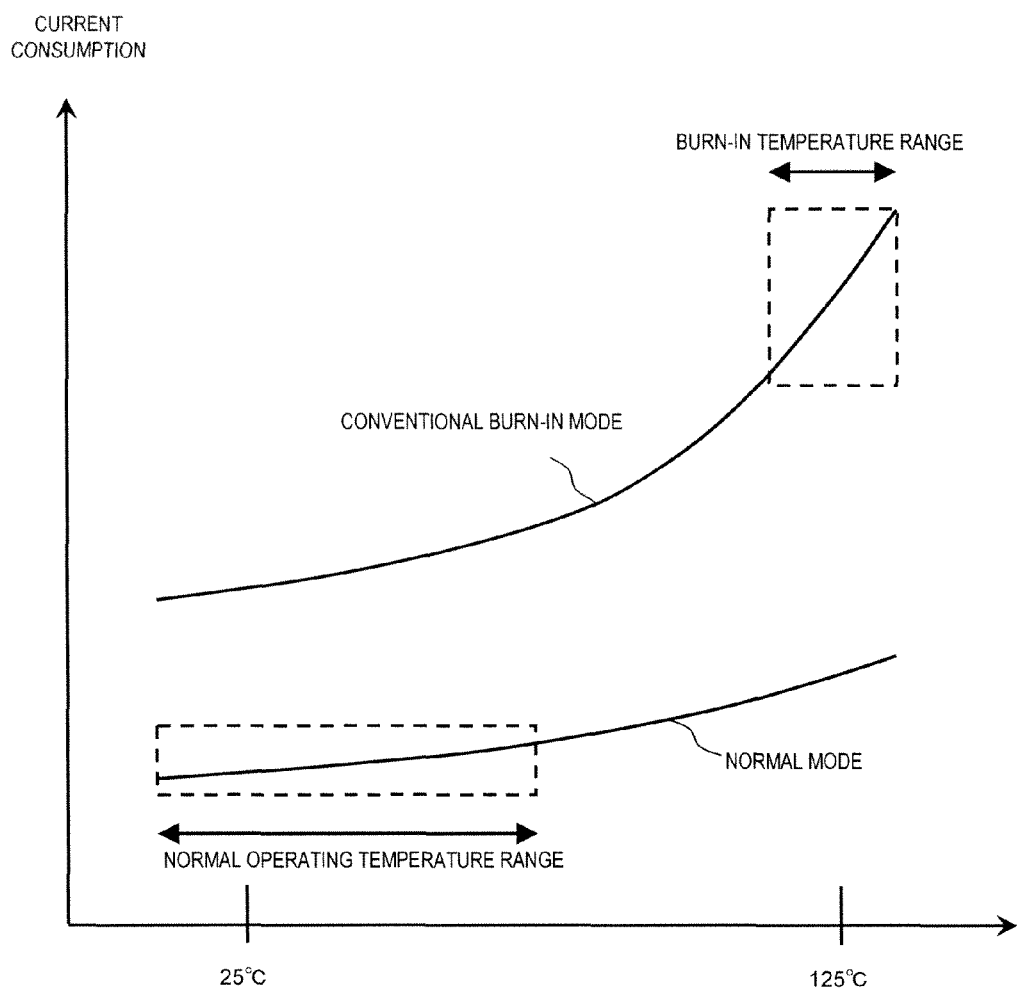
FIG. 4 is a graph showing current consumptions in a conventional burn-in mode and a normal mode.

FIG. 4 shows a comparison between current consumption in a conventional burn-in mode and current consumption in a normal mode in which a semiconductor device is actually used. A horizontal axis in FIG. 4 indicates ambient temperature and a vertical axis indicates current consumption. While a power supply voltage VDD of 1.5 V is supplied in the normal mode, a power supply voltage VDD of 3.0 V is supplied in the burn-in mode. It is because a high voltage is applied as the power supply voltage to accelerate screening. Accordingly, the current consumption in the burn-in mode becomes larger than the current consumption in the normal mode due to a difference between the supplied power supply voltages. In the normal mode, the semiconductor device is usually used at a temperature in the vicinity of an ambient temperature Temp of 25° C., burn-in in the burn-in mode is performed under a high temperature in the vicinity of an ambient temperature Temp of 125° C. It is because screening can be accelerated at the high temperature. FIG. 4 shows each of variation ranges of ambient temperature and current consumption in the normal mode and the conventional burn-in mode, by a dotted line. In the normal mode, for example, the semiconductor device is assumed to be used at the ambient temperature from 0 to 85° C., and burn-in is performed at the ambient temperature in the vicinity of 125° C. Accordingly, as shown in FIG. 4, current consumption in the conventional burn-in mode becomes significantly larger than that in the normal mode due to an ambient temperature difference, in addition to the power supply voltage difference (between the power supply voltage of 1.5 V in the normal mode and the power supply voltage of 3.0 V in the burn-in mode).

Figure 13B:
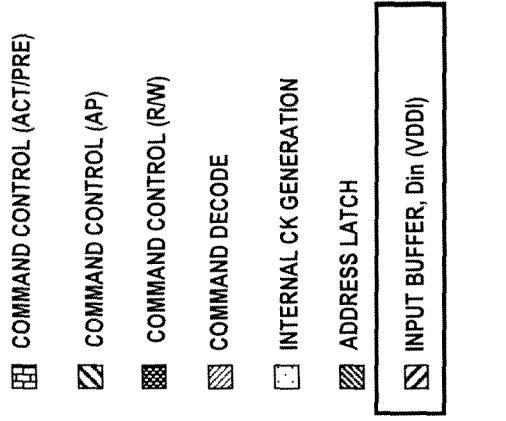
FIGS. 13A and 13B are diagrams each showing a result of analysis of current consumption in the burn-in mode.
Figure 13A:
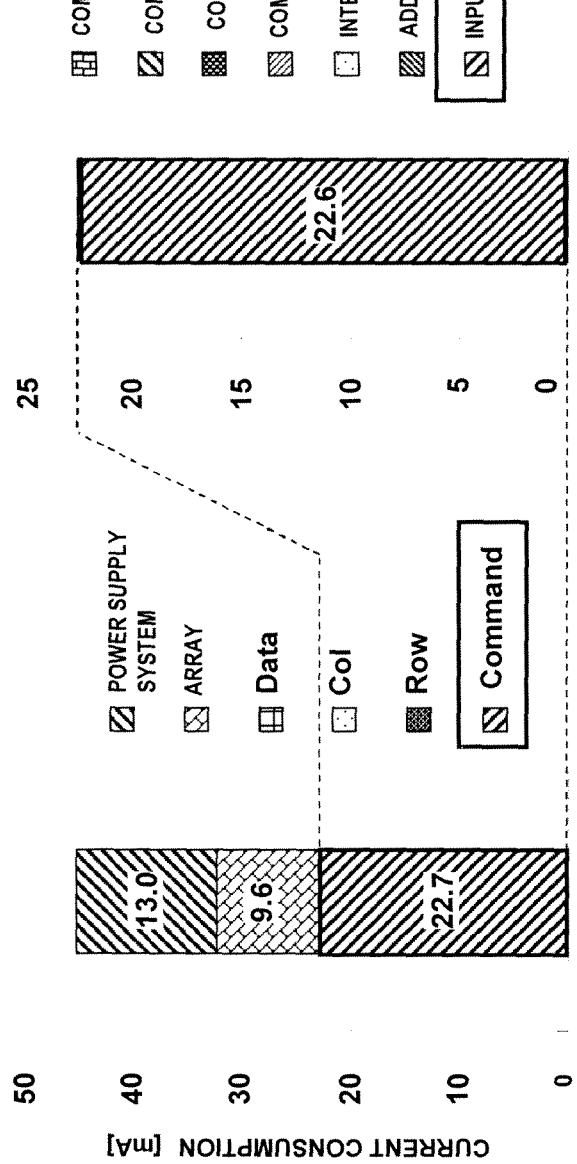

Each of FIGS. 13A and 13B shows an analysis result of current consumption in the burn-in mode. Referring to FIGS. 13A and 13B, burn-in was performed for a DDRSDRAM (Double-Data-Rate Synchronous Dynamic Random Access Memory) (TYP) having standard threshold PMOS and NMOS transistors, at an ambient temperature of 125° C. and by giving a clock tCK of 320 ns.

FIG. 13A shows an analysis of current consumption in the burn-in mode of an entire DRAM semiconductor chip. A current consumption of a power supply system (indicated by "power supply system" in FIG. 13A) is 13.0 mA, a current consumption of a DRAM cell array (indicated by "array" in FIG. 13A) is 9.6 mA, a current consumption of a command control system (indicated by "Command" in FIG. 13A) is 22.7 mA, and the other current consumptions (indicated by "Data", "Col", and "Row" in FIG. 13A) of a data system, a column address system, and a row address system are at levels that are smaller than those of the power supply system, the DRAM cell array, and the command control system and are negligible (e.g., these current consumptions are too small to be illustrated in FIG. 13A).

As shown in FIG. 13B, a current consumption of "input buffer, Din (VDDI)" is 22.6 mA in 22.7 mA of the current consumption of the command control system (Command). Current consumptions needed for "command control (ACT/PRE)", "command control (AP)", "command control (R/W)", "command decode", "internal CK generation", and "address latch" are too negligible to be illustrated in FIG. 13B, compared with than the current consumption of "input buffer, Din (VDDI)". It can also be seen from FIGS. 13A and 13B that the current consumption of "input buffer, Din (VDDI)" accounts for approximately a half of the current consumption of "approximately 45 mA) of the entire chip.

Figure 5:
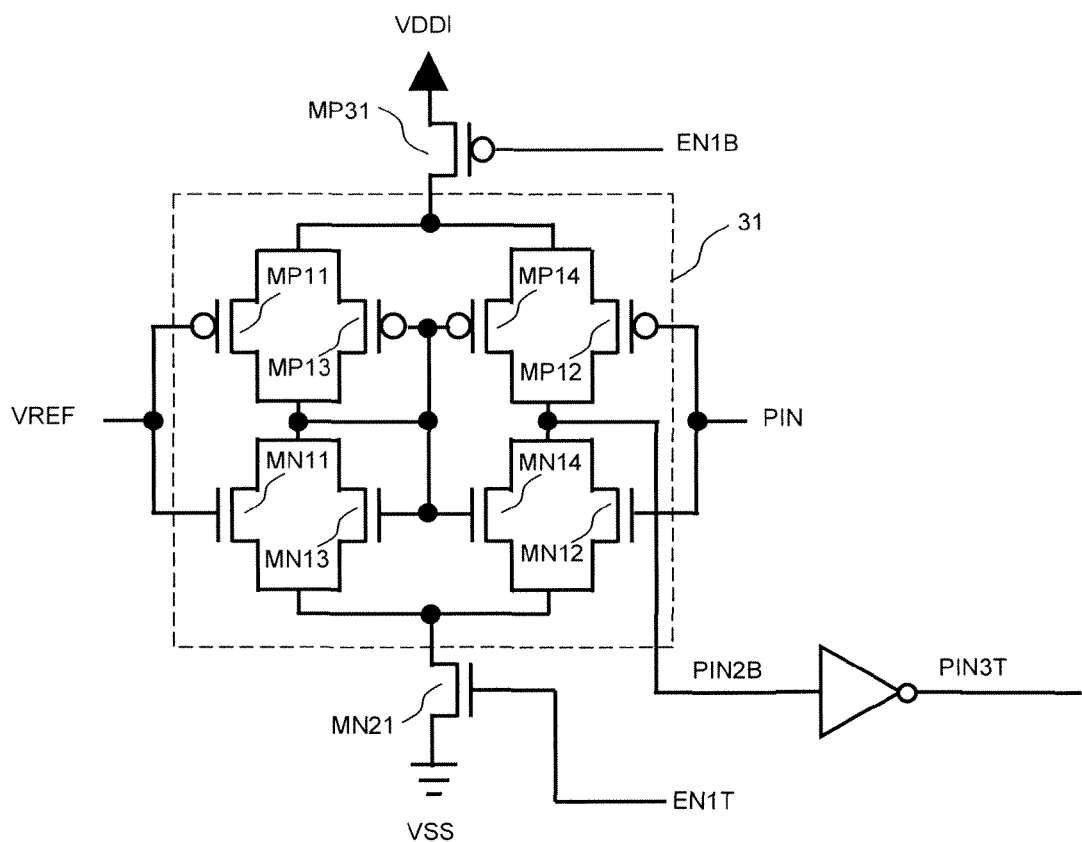
FIG. 5 is a circuit block diagram of a related-art QCR type input initial stage circuit described in Patent Document 2.

FIG. 5 is a QCR (Quad-Coupled Receiver) type input initial stage circuit described in Patent Document 2. This QCR type input initial stage circuit is a circuit in which an input signal PIN received from an input terminal thereof is compared with a reference voltage VREF, a potential difference between the input signal PIN and the reference voltage VREF is amplified to be output as an output signal PIN2B. This QCR type input initial stage circuit includes a differential circuit 31, a PMOS transistor MP31 that supplies power to the differential circuit 31 from a first power source VDDI, an NMOS transistor MN21 that supplies power from a second power source VSS, and an inverter that shapes and inverts a waveform of the output signal PIN2B, for output as an output signal PIN3T.

The differential circuit 31 includes a first differential pair of NMOS transistors MN11 and MN12, a first load circuit of PMOS transistors MP13 and MP14 for the first differential pair, a second differential pair of PMOS transistors MP11 and MP12, and a second load circuit of NMOS transistors MN13 and MN14. A pair of input signals of the input signal PIN and the reference voltage VREF is connected to both of the first differential pair and the second differential pair.

This differential circuit 31 includes the first differential pair of the NMOS transistors MN11 and MN12 and the first load circuit for the first differential pair and the second differential pair of the PMOS transistors MP11 and MP12 and the second load circuit for the second differential pair. Accordingly, when voltage values of the reference voltage VREF and the input signal PIN are low and close to a second power supply voltage VSS, the second differential pair and the second load circuit mainly function. When voltage values of the reference voltage VREF and the input signal PIN are high and close to a first power supply voltage VDDI, the first differential pair and the first load circuit mainly function. Accordingly, the QCR type input initial stage circuit can operate at high speed irrespective of the voltage values of the reference voltage VREF and the input signal PIN.

When operation of the semiconductor device is stopped and it is not necessary to monitor a level change of the input signal PIN received from the input terminal, an EN1T signal, which is an activation control signal, is driven low, and an EN1B signal is driven high, thereby holding both of the power supply transistors MP31 and MN21 to be turned off. Then, supply of the powers to the differential circuit 31 is stopped, so that no current flows through the differential circuit 31.

On the other hand, when it is necessary to monitor rise and fall of the input signal Pin and output the output signal at high speed, in response to a change in the input signal PIN, it is necessary to drive the activation control signal EN1T signal high and drive the EN1B signal low, thereby turning on the power supply transistors MP31 and MN21, irrespective of an actual logic level change of the input signal PIN. The reference voltage VREF is set to an intermediate voltage in this case. Thus, bias current flows through the differential circuit 31, irrespective of a change in voltage of the input signal PIN.

Especially when a high-speed operation is demanded, a value of the current needed to be flown through the differential circuit 31 also increases. When a high supply voltage is applied under a high temperature in the burn-in mode in particular as described using FIG. 4, current that is flown through the differential circuit 31 also increases, thereby boosting up current consumption of the entire semiconductor device. In that case, the number of semiconductor devices to be mounted on each burn-in board 102 is limited due to limitation of current consumption of the burn-in apparatus 101 or the burn-in board 102, as described using FIG. 2.

First Exemplary Embodiment

FIG. 1 is a diagram of circuits in the vicinity of a QCR type input initial stage circuit in a semiconductor device 10 according to a first exemplary embodiment. A configuration of the semiconductor device 10 in the first exemplary embodiment will be described, using FIG. 1. Referring to FIG. 1, the semiconductor device 10 includes a fuse element 40 and a reading circuit 41. The reading circuit 41 reads a state indicating whether or not the fuse element 40 is cut or not. The fuse element 40 is an example of a non-volatile memory. An anti-fuse element or other non-volatile memories such as a semiconductor non-volatile memory may be used in place of the fuse element 40. An exclusive OR circuit 51 receives a TESTA signal that is a test mode signal, and a logic of the fuse element 40 read by the reading circuit 41 as a FuseA signal. The exclusive OR circuit 51 takes an exclusive OR of this TESTA signal and the FuseA signal, for output as a first control signal CNT1. A NAND circuit 52 takes a NAND logic of a burn-in mode signal BURN-IN and the first control signal CNT1 to output a (inverted) current limitation signal CSB (which is active low). The burn-in mode signal BURN-IN is a control signal that becomes active (high level) in a burn-in mode, and becomes inactive (low level) when the semiconductor device 10 is not in the burn-in mode. The (inverted) current limitation signal CSB and output from the NAND circuit is a control signal that limits current that will flow through a differential circuit 31 when the current limitation signal CSB is active (low level).

A first power supply circuit including a PMOS transistor MP1 and a second power supply circuit in which PMOS transistors MP2 and MP3 are connected in series are provided in parallel between a power source VDDI and the differential circuit 31. An inverted activation control signal EN1B (which is active low) is connected to gates of the PMOS transistors MP1 and MP3. A signal obtained by inverting a logic of the current limitation signal CSB by an inverter 53 is connected to a gate of the PMOS transistor MP2.

With the above-mentioned connection, when the activation control signal EN1B is low, the first power supply circuit (MP1) is controlled to be turned on, irrespective of the logic of the current limitation signal CSB to supply power VDDI to the differential circuit 31. On the other hand, when the activation control signal EN1B is high, the first power supply circuit (MP1) is controlled to be turned off, irrespective of the logic of the current limitation signal CSB to stop supply of the power from the power source VDDI to the differential circuit 31.

When the current limitation signal CSB is high and the activation control signal EN1B is low, the PMOS transistors MP2 and MP3 in the second power supply circuit (MP2, MP3) are controlled to be turned on. In this case, the second power supply circuit (MP2, MP3) supplies power supply current to the differential circuit 31 from the power source VDD in parallel with the first power supply circuit (MP1).

On the other hand, when the current limitation signal CSB goes low or the activation control signal EN1B is high, at least one of the PMOS transistors MP2 and MP3 connected in series is controlled to be turned off. In this case, the second power supply circuit (MP2, MP3) stops supply of power from the power source VDDI to the differential circuit 31.

Similarly, a third power supply circuit including an NMOS transistor MN1 and a fourth power supply circuit in which NMOS transistors MN2 and MN3 are connected in series are provided in parallel between a power source VSS and the differential circuit 31. A noun-inverted activation control signal EN1T is connected to gates of the NMOS transistors MN1 and MN3. The activation control signal EN1B is obtained by inverting a logic of the activation control signal EN1T. The current limitation signal CSB is connected to the gate of the PMOS transistor MP2.

With the above-mentioned connection, when the activation control signal EN1T is high, the third power supply circuit (MN1) is controlled to be turned on, irrespective of the logic of the current limitation signal CSB to connect the power source VSS to the differential circuit 31. On the other hand, when the activation control signal EN1T is low, the third power supply circuit (MN1) is controlled to be turned off, irrespective of the logic of the current limitation signal CSB to stop connection of the power source VSS to the differential circuit 31.

When the current limitation signal CSB is high and the activation control signal EN1T is high, the NMOS transistors MN2 and MN3 in the fourth power supply circuit (MN2, MN3) are controlled to be turned on. In this case, the second power supply circuit (MN2, MN3) connects the power source VSS to the differential circuit 31 in parallel with the third power supply circuit (MN1).

On the other hand, when the current limitation signal CSB goes low or the activation control signal EN1T is low, at least one of the NMOS transistors MN2 and MN3 connected in series is controlled to be turned off. In this case, the fourth power supply circuit (MN2, MN3) stops connection of the power source VSS to the differential circuit 31.

Next, an internal circuit of the differential circuit 31 will be described. The differential circuit 31 itself is the same as the differential circuit of the QCR (Quad-Coupled Receiver) type input initial stage circuit described in Patent Document 2 already explained using FIG. 5. The differential circuit 31 includes a first differential pair (MN11, MN12) that is connected to the third and fourth power supply circuits (MN1 to MN3). The reference voltage VREF is supplied to one of differential inputs of the first differential pair, and an input signal PIN is connected to the other of the differential inputs of the first differential pair. A first load circuit (MP13, MP14) is provided between the first differential pair (MN11, MN12) and the first and second power supply circuits (MP1 to MP3). An output signal PIN2B is taken out from at least one of a pair of connecting points between the first differential pair (MN11, MN12) and the first load circuit (MP13, MP14).

The differential circuit 31 further includes a second differential pair (MP11, MP12) that is connected to the first and second power supply circuits (MP1 to MP3). The reference voltage VREF is supplied to one of differential inputs of the second differential pair, and the input signal PIN is connected to the other of the differential inputs of the second differential pair. A second load circuit (MN13, MN14) is provided between the second differential pair (MP11, MP12) and the third and fourth power supply circuits (MN1 to MN3). A pair of connecting points between the second differential pair (MP11, MP12) and the second load circuit (MN13, MN14) is also connected to each of the first differential pair (MN11, MN12) and the first load circuit (MP13, MP14).

The input signal PIN is an external input signal received from an external connection terminal of the semiconductor device 10 not shown. When the activation control signals EN1T and EN1B are at active levels (where the activation control signal EN1T is high and the activation control signal EN1B is low), the differential circuit 31 compares a voltage level of the external input signal PIN with the reference voltage VREF, and outputs a result of the comparison as the output signal PIN2B and an output signal PIN3T.

Operation of First Exemplary Embodiment

When the semiconductor device 10 in FIG. 1 is not in the burn-in mode, the burn-in mode signal Burn-In is low. Thus, the inverted current limitation signal CSB is fixed at a high level. In this case, the PMOS transistor MP2 and the NMOS transistor MN2 are both fixed to be on. The second power supply circuit (MP2, MP3) is controlled to be turned on or off in parallel with the first power supply circuit MP1 according to tie activation control signal (EN1B), and the fourth power supply circuit (MN2, MN3) is controlled to be turned on or off in parallel with the second power supply circuit MN1 according to the activation control signal (EN1T). Accordingly, operation of the semiconductor device 10 is not functionally changed from that of the related-art QCR (Quad-Coupled Receiver) type input initial stage circuit shown in FIG. 5. The semiconductor device 10, however, is just different from the related-art QCR (Quad-Coupled Receiver) type input initial stage circuit in that in addition to the first power supply circuit and the third power supply circuit, the second power supply circuit supplies power to the differential circuit in parallel with the first power supply circuit and the fourth power supply circuit supplies power to the differential circuit in parallel with the third power supply circuit.

Next, assume that one of the TESTA signal, which is the test mode signal, and the FuseA signal is high and the other of the TESTA signal and the FuseA signal is low when the burn-in mode signal BURN-IN is high in the burn-in mode. Then, the inverted current limitation signal CSB becomes active (low level). Then, control is performed so that both of the second power supply circuit and the fourth power supply circuit stop supply of the powers to the differential circuit 31, and only the first and third power supply circuits supply the powers to the differential circuit 31. Accordingly, current that will flow through the differential circuit 31 is reduced.

Since the exclusive OR circuit (exclusive OR gate) 51 is used for synthesis of the TESTA signal and the FuseA signal. Thus, by controlling a logic of the TESTA signal, which is the test mode signal, current that will flow through the differential circuit 31 can be reduced in the burn-in mode even if the fuse element 40 is not cut. It is also possible not to reduce the current that will flow through the differential circuit 31 in the burn-in mode when the fuse element 40 is cut.

The semiconductor device 10 in the first exemplary embodiment includes the QCR type input initial stage circuit and control circuits of the QCR type input initial stage circuit shown in FIG. 1. Accordingly, burn-in can be performed as follows. First, functions of the semiconductor devices 10 are tested in a P/W process (test process of the semiconductor devices 10 in a state of a semiconductor wafer) to exclude a defective product. Together with this operation, based on a result of the test, the magnitude of current consumption of each good product during burn-in of the sample of the good product is predicted. When it is predicted that current consumption varies to be large, the fuse element 40 is cut. The semiconductor devices 10 are obtained by pelletizing the semiconductor wafer to be subdivided into pellets and assembled into packages. After the test has been carried out again after the assembly if needed, the burn-in is performed. In the semiconductor device 10 whose current consumption has been predicted to increase in the P/W process in this case, the fuse element 40 is cut. Accordingly, current that will flow through the differential circuit 31 is reduced during the burn-in. On the other hand, current that will flow through the semiconductor device 10 with the fuse element 40 therein not cut is not reduced. Accordingly, the burn-in can be adequately accelerated, making use of a high-voltage and high-temperature environment.

Effect of First Exemplary Embodiment

Figure 10:
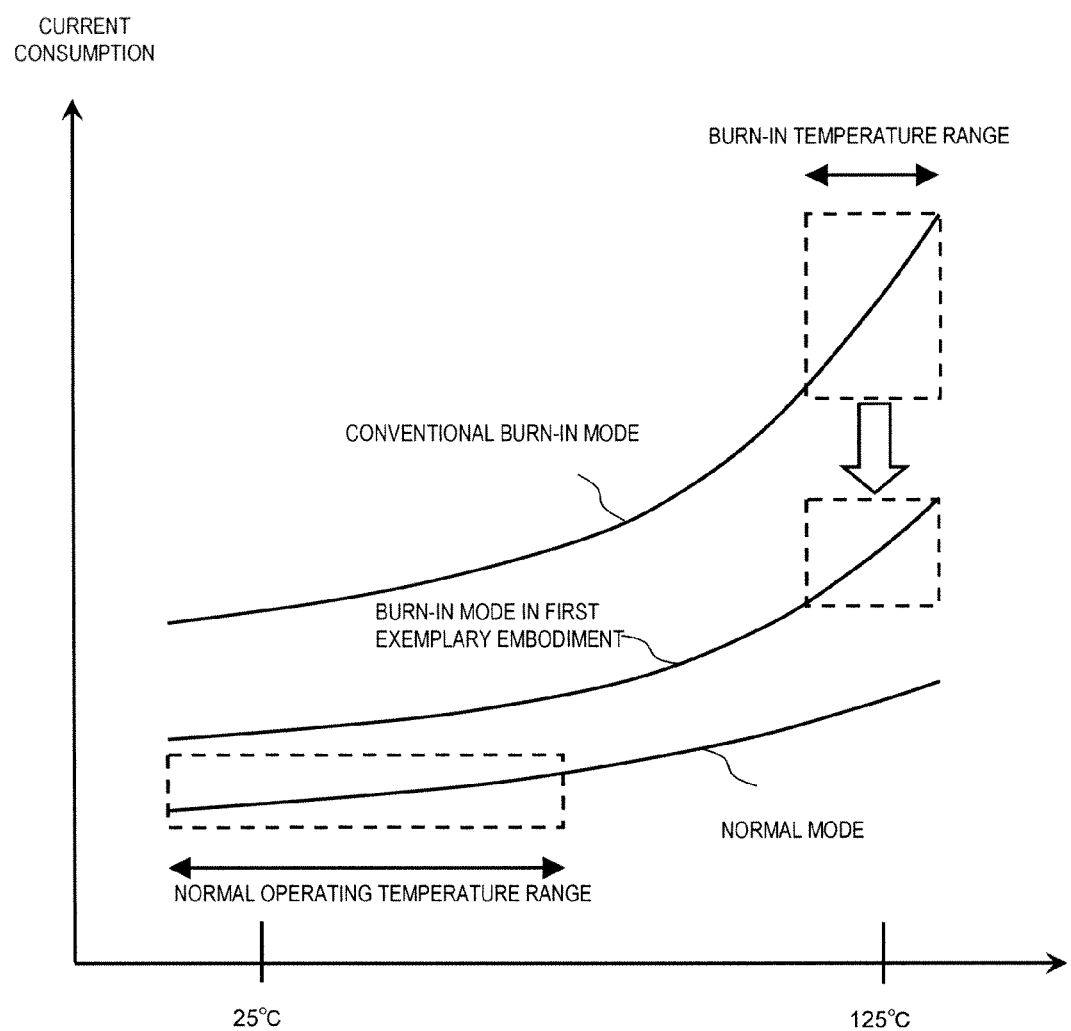
FIG. 10 is a graph showing a comparison among current consumption in the conventional burn-in mode, current consumption in a burn-in mode in the first exemplary embodiment, and current consumption in the normal mode.

FIG. 10 is a graph showing a comparison among current consumption in a conventional burn-in mode, current consumption in the burn-in mode in the first exemplary embodiment, and current consumption in a normal mode. FIG. 10 corresponds to a graph in which the current consumption in the burn-in mode in the first exemplary embodiment is added to the current consumptions in the conventional burn-in mode and the normal mode in FIG. 4 which was already explained. Accordingly, a horizontal axis in FIG. 10 indicates ambient temperature, and a vertical axis in FIG. 10 indicates current consumption, as in FIG. 4. A power supply voltage VDD in the normal mode is 1.5 V, and a power supply voltage VDD is 3.0 V in the burn-in mode.

As can be readily seen from FIG. 10, maximum current consumption in the burn-in mode in the first exemplary embodiment can be reduced more than in the conventional burn-in mode. Further, in the first exemplary embodiment, current limitation is performed for each semiconductor device 10 whose maximum current consumption in the burn-in mode can be predicted to exceed a certain value. Thus, acceleration of screening is not impeded in burn-in of the semiconductor devices other than those for which current limitation is performed.

Second Exemplary Embodiment

Figure 6:
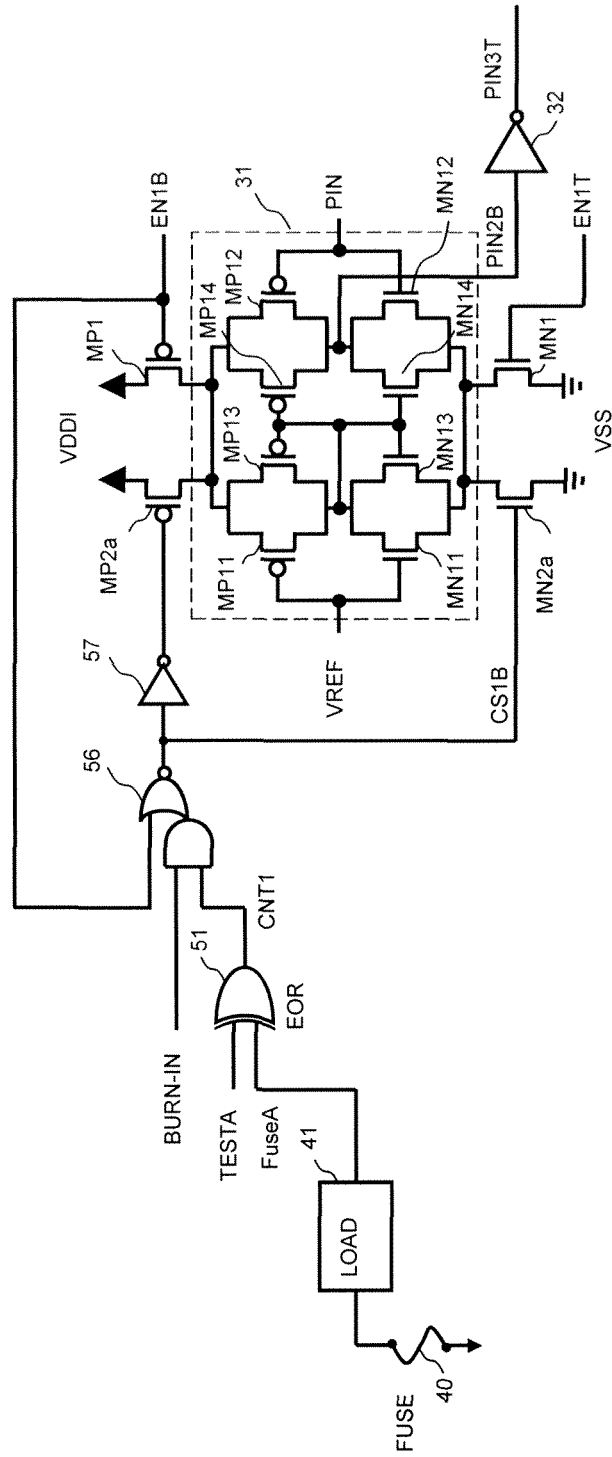
FIG. 6 is a block diagram of circuits in the vicinity of a QCR type input initial stage circuit in a semiconductor device in a second exemplary embodiment.

FIG. 6 is a block diagram of circuits in the vicinity of a QCR type input initial stage circuit in a semiconductor device 10a in a second exemplary embodiment. Same reference numerals are assigned to components that are substantially the same as those in the first exemplary embodiment shown in FIG. 1 already explained. Duplicate description of such components will be thereby omitted.

In a second power supply circuit MP2a and a fourth power supply circuit MN2a in the second exemplary embodiment shown in FIG. 6, the second power supply circuit (MP2, MP3) composed of the two transistors connected in series and the fourth power supply circuit (MN2, MN3) composed of the two transistors connected in series in the first exemplary embodiment in FIG. 1 are respectively replaced with transistors MP2a and MN2a. Logics of the current limitation circuits (51, 52) in the first exemplary embodiment which control the second and fourth power supply circuits are replaced with those of the exclusive OR circuit 51 and an AND-NOR circuit 56.

A logic of the exclusive OR circuit 51 is the same as that in the first exemplary embodiment shown in FIG. 1. The AND-NOR circuit 56 is functionally formed of a logic AND gate connected between a first control signal CNT1 and a burn-in mode signal BURN-IN and a logic NOR gate connected between this logic AND gate and an inverted activation control signal EN1B. A current limitation signal obtained by inverting the logic of the inverted current limitation signal CSB in the first exemplary embodiment is obtained by this logic AND gate. In the second exemplary embodiment, this current limitation signal is not directly used for control over the second and fourth power supply circuits. The second and fourth power supply circuits are controlled using a signal CS1B and the inverted signal of the signal CS1B. The signal CS1B is obtained by taking a NOR logic of the inverted activation control signal EN1B and the current limitation signal. This control signal CS1B is a signal that goes high when the inverted activation control signal EN1B is active (low level) and one of the burn-in mode signal BURN-IN and the first control signal CNT1 is high. When the control signal CS1B goes high, the PMOS transistor MP2a of the second power supply circuit and the NMOS transistor MN2a of the fourth power supply circuit are both controlled to be turned on. On the other hand, when the inverted activation control signal EN1B is inactive (high level) or when both of the burn-in mode signal BURN-IN and the first control signal CNT1 are high, the control signal CS1B goes low, and the second and fourth power supply circuits are controlled to be turned off.

The QCR type input initial stage circuit in the semiconductor device 10a in the second exemplary embodiment has a same function as that in the first exemplary embodiment. However, when compared with the first exemplary embodiment, each of the second and fourth power supply circuits is constituted from one transistor, so that the layout area of the semiconductor device 10a can be reduced from that of the semiconductor device in which the two transistors are connected in series as in the first exemplary embodiment. The other respects are same as those in the first exemplary embodiment.

Variation Example of Second Exemplary Embodiment

Figure 7:
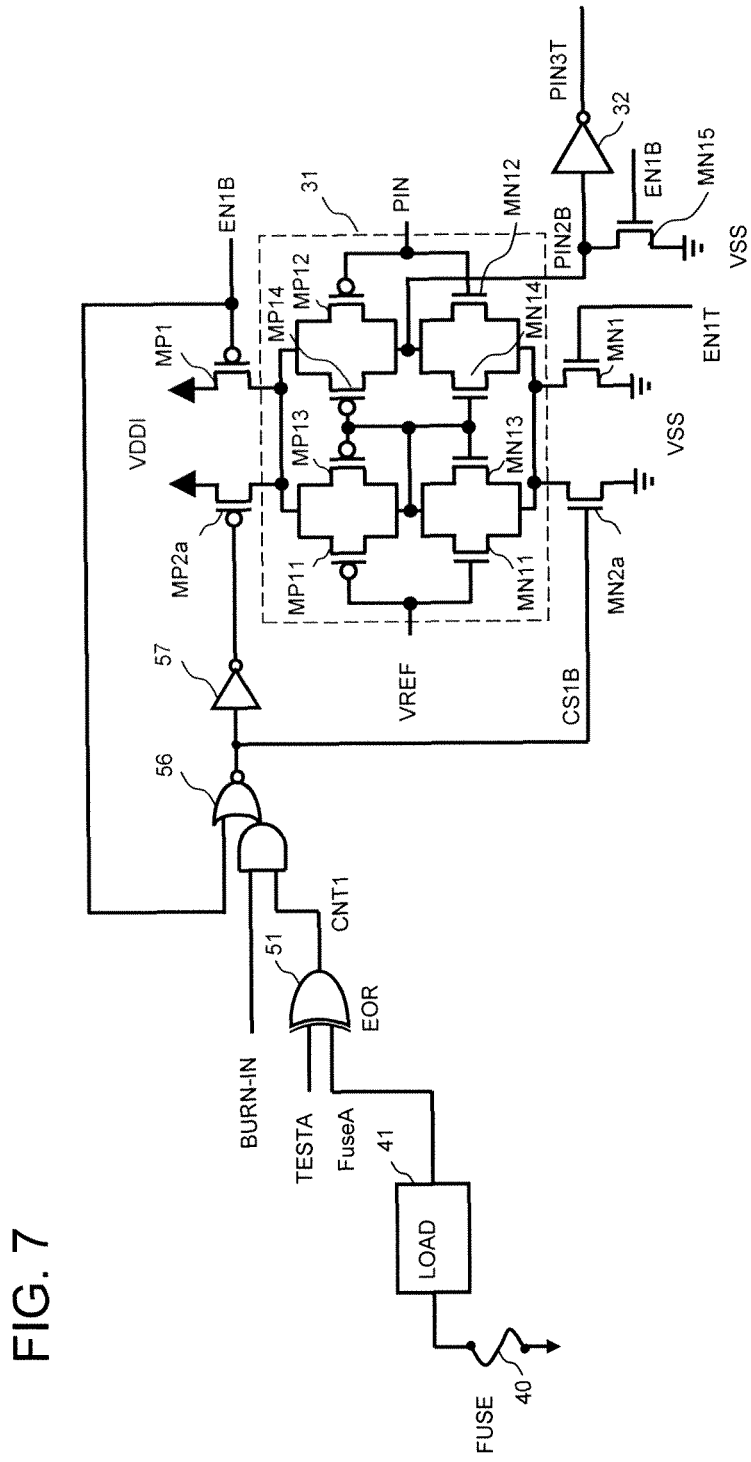
FIG. 7 is a block diagram of circuits in the vicinity of a QCR type input initial stage circuit in a variation example of the second exemplary embodiment.

When the activation control signals EN1B and EN1T are inactive in the first and second exemplary embodiments, the differential circuit 31 is electrically disconnected from both of the first power source VDDI and the second power source VSS. Accordingly, an output signal PIN2B becomes indefinite. For this reason, when through current of a gate circuit (such as an inverter 32) that receives the output signal PIN2B becomes a problem, a transistor should be provided for fixing the output signal PIN2B at a high level or a low level when the activation control signals EN1B and EN1T become inactive, as in a semiconductor device 10b according to a variation example of the second exemplary embodiment shown in FIG. 7. Referring to FIG. 7, a pull-down NMOS transistor MN15 with the inverted activation control signal EN1B connected to a gate thereof is provided.

Third Exemplary Embodiment

Figure 8:
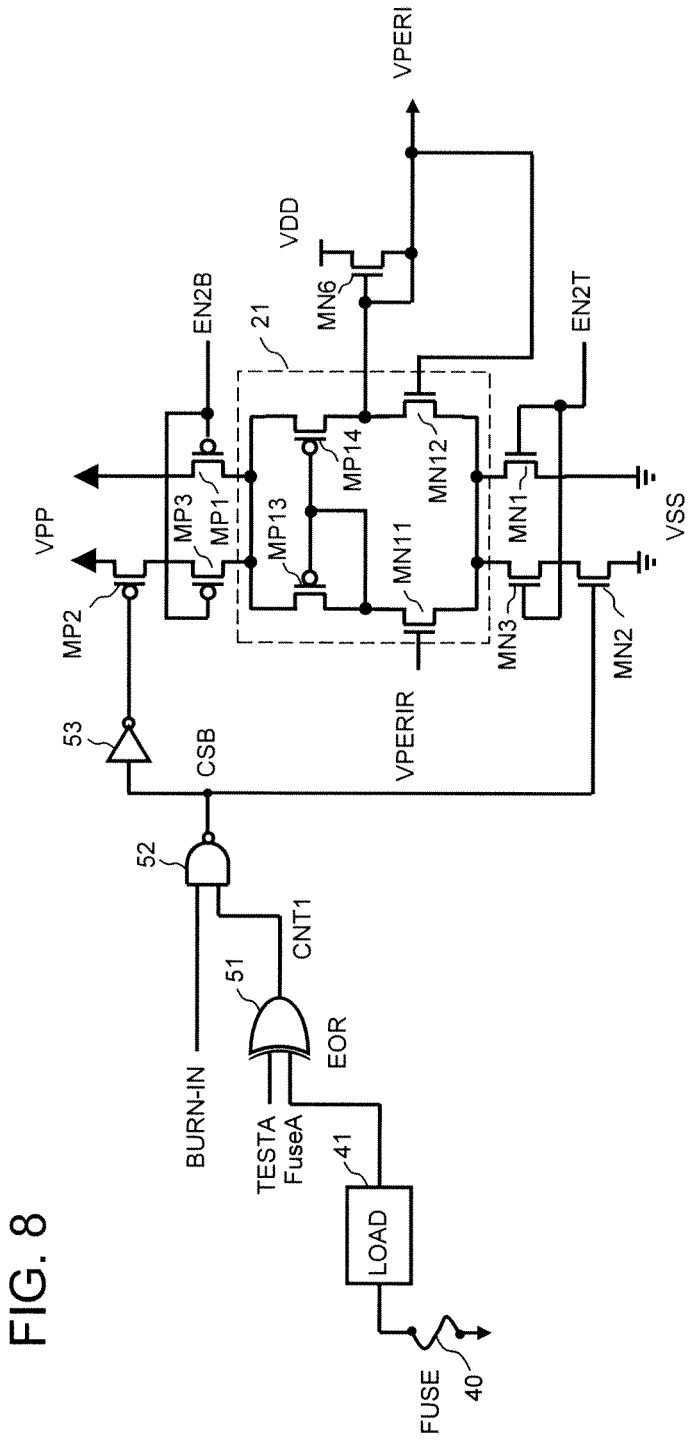
FIG. 8 is a block diagram of circuits in the vicinity of a constant-voltage power supply circuit in a semiconductor device in a third exemplary embodiment.

FIG. 8 is a block diagram of circuits in the vicinity of a constant-voltage power supply circuit in a semiconductor device 10c in a third exemplary embodiment. In description of the third exemplary embodiment, same reference numerals are assigned to components that are the same as those in the first exemplary embodiment shown in FIG. 1, thereby omitting duplicate explanation of the same components. In the semiconductor device 10c in the third exemplary embodiment shown in FIG. 8, the differential circuit 31 in the first exemplary embodiment shown in FIG. 1 is replaced with a differential circuit 21. The semiconductor device 10c includes a constant-voltage power supply circuit MN6 whose voltage value is controlled by an output signal of the differential circuit 21. An output voltage VPERI of the constant-voltage power supply circuit is feedback-connected as an input signal to a differential pair of the differential circuit. The name of a reference voltage signal is VPERIR, and the names of activation control signals are EN2B and EN2T. The names of these signals are different from those in the first exemplary embodiment. However, functions of these signals are the same as those in the first exemplary embodiment. A power supply VPP has a voltage higher than a power supply VDD and is generated inside the semiconductor device 10c. A gate in a system of the power supply VPP is used for each of a NAND circuit 52 and an inverter circuit 53.

Compared with the differential circuit 31 in the first exemplary embodiment, the second differential pair and the second load circuit in the first exemplary embodiment are omitted from the differential circuit 21 in the third exemplary embodiment. A first differential pair (of NMOS transistors MN11 and MN12) and a first load circuit (of PMOS transistors MP13 and MP14) are common to those in the first exemplary embodiment. Assume that a voltage value of a reference voltage VPERIR enough for the NMOS transistor MN11 to operate can be adequately ensured. Then, the second differential pair and the second load circuit as in the first exemplary embodiment can be omitted.

A constant-voltage power supply circuit MN6 includes an NMOS transistor MN6 with a source thereof connected to a power source VDD and a gate and a drain thereof connected to an output voltage VPERI. The output voltage VPERI of the constant-voltage power supply circuit MN6 is supplied to an internal circuit of the semiconductor device 10c as a power supply.

Fourth Exemplary Embodiment

Figure 9:
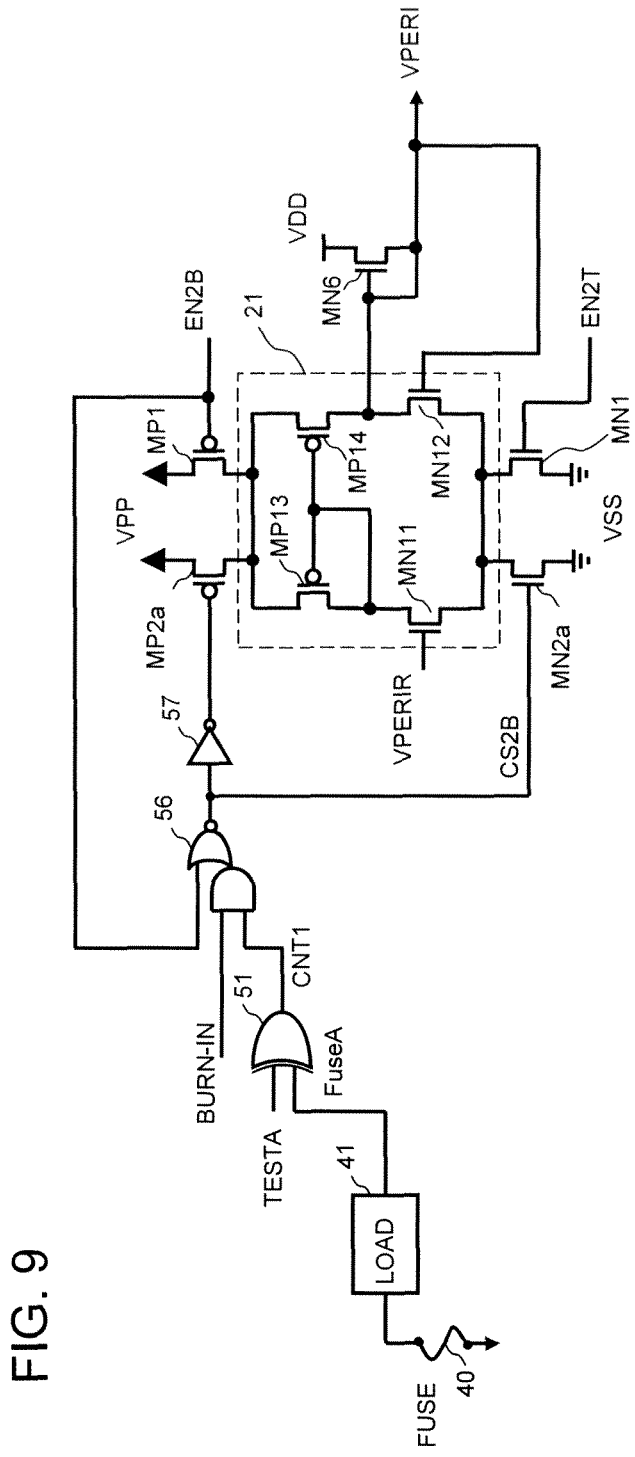
FIG. 9 is a block diagram of circuits in the vicinity of a constant-voltage power supply circuit in a semiconductor device in a fourth exemplary embodiment.

FIG. 9 is a block diagram of circuits in the vicinity of a constant-voltage power supply circuit in a semiconductor device 10d in a fourth exemplary embodiment. Same reference numerals are assigned to components that are the same as those in the first to third exemplary embodiments shown in FIGS. 1, 6, and 8, thereby omitting duplicate explanation of the same components. The fourth exemplary embodiment corresponds to an exemplary embodiment in which the differential circuit 21 and the constant-voltage power supply circuit in the third exemplary embodiment are combined with the second and fourth power supply circuits in the second exemplary embodiment.

In a second power supply circuit MP2a and a fourth power supply circuit MN2a in the fourth exemplary embodiment shown in FIG. 9, the second power supply circuit (MP2, MP3) and the fourth power supply circuit (MN2, MN3) each of which is constituted from the two transistors connected in series in the third exemplary embodiment in FIG. 8 are respectively replaced by the transistors MP2a and MN2a. A logic of the current limitation circuit (51, 52) in the third exemplary embodiment for controlling the second and fourth power supply circuits is replaced by a logic of the exclusive-OR circuit 51 and the AND-NOR circuit 56.

A logic of the exclusive-OR circuit is the same as that in each of the first and third exemplary embodiment shown in FIGS. 1 and 8. The AND-NOR circuit 56 is functionally formed of a logic AND gate connected between a first control signal CNT1 and a burn-in mode signal BURN-IN and a logic NOR gate connected between this logic AND gate and an inverted activation control signal EN2B. A current limitation signal is obtained by inverting the logic of the current limitation signal CSB resulting from the inversion in the first and third exemplary embodiments, using this logic AND gate. In the fourth exemplary embodiment, this current limitation signal is not directly used for control over the second and fourth power supply circuits. The second and fourth power supply circuits are controlled using a signal CS2B and the inverted signal of the signal CS2B. The signal CS2B is obtained by further taking a NOR logic of the inverted activation control signal EN2B and the current limitation signal. This control signal CS2B is a signal that goes high when the inverted activation control signal EN2B is active (low level) and one of the burn-in mode signal BURN-IN and the first control signal CNT1 is low. When the control signal CS2B goes high, the PMOS transistor MP2a in the second power supply circuit and the NMOS transistor MN2a in the fourth power supply circuit are both controlled to be turned on. On the other hand, when the inverted activation control signal EN2B is inactive (high level) or when both of the burn-in mode signal BURN-IN and the first control signal CNT1 are high, the control signal CS2B goes low, and the second and fourth power supply circuits are controlled to be turned off.

The constant-voltage power supply circuit in the semiconductor device 10d in the fourth exemplary embodiment has a same function as that in the third exemplary embodiment. However, compared with the third exemplary embodiment, the second power supply circuit is formed of one transistor MP2a, and the fourth power supply circuit is formed of one transistor MN2a. Thus, the layout area of each of the second and fourth power supply circuits can be reduced from that of the two transistors connected in series as shown in the third exemplary embodiment. The other respects are the same as those in the third exemplary embodiment.

Fifth Exemplary Embodiment

FIG. 11 is a block diagram of circuits of an entire semiconductor device in a fifth exemplary embodiment. A semiconductor device 10e shown in FIG. 11 is a synchronous semiconductor memory device that operates in synchronization with a clock supplied from an outside. It is to be noted that, in FIG. 11, description of a portion not so deeply related to the invention is omitted.

Referring to FIG. 11, reference character CK indicates a clock signal input terminal, reference character CKB indicates an inverted clock input terminal, reference character CKE indicates a clock enable signal input terminal. When a clock enable signal CKE received from the clock enable signal input terminal is active, a clock generator 61 generates an internal clock signal INTCK in synchronization with clock signals supplied from the clock input terminal CK and the inverted clock input terminal CKB, and supplies the internal clock signal INTCK to an inside of the semiconductor device 10e. The clock generator 61 stops generation of the internal clock signal INTCK based on clock signals CK and CKB supplied from an outside when the clock enable signal CKE is inactive.

ADR/CMD1 to ADR/CMDn terminals are terminals to which address signals and/or command signals given from the outside are supplied. The number of the terminals n is an arbitrary integer being two or more, determined by product specifications. QCR type input circuits QCR1 to QCRn (30) are respectively provided corresponding to the ADR/CMD1 to ADR/CMDn terminals, and are circuits that receive the address signals and/or the command signals given from the ADR/CMD1 to ADR/CMDn terminals. The QCR input initial stage circuit in the first exemplary embodiment or the second exemplary embodiment described using FIG. 1, or FIGS. 6 and 7 is used for an initial stage of each of the QCR type input circuits QCR1 to QCRn (30). A register that temporarily holds the address signal and/or the command signal as necessary is provided for a subsequent stage inside each of the QCR type input circuits QCR1 to QCRn (30). A reference voltage VREF, a current limitation signal CSB, and a first activation control signal EN1T are supplied to each of the QCR type input circuits QCR1 to QCRn (30). An inverted activation control signal EN1B is generated by inverting a logic of the first activation control signal EN1T.

Reference characters VDD and VSS respectively indicate terminals of power supplies provided to the semiconductor device 10e from the outside. A higher voltage than that for the VSS terminal is supplied to the VDD terminal. A reference voltage generation circuit 66 generates voltages necessary for the inside of the semiconductor device 10e from power supplies VDD and VSS provided from the outside. The reference voltage VREF is supplied to each of the QCR type input circuits QCR1 to QCRn (30), and a reference voltage VPERIR is supplied to an internal power supply circuit 20.

At least one fuse element 40 is provided for a fuse circuit 400. A reading circuit 41 reads information indicating whether or not the fuse element 40 in the fuse circuit 400 is cut. A burn-in control circuit 50 generates the current limitation signal CSB which is a signal for limiting current consumption of each of the QCR type input circuits QCR1 to QCRn (30) and the internal power supply circuit 20 during burn-in, based on an output signal of the reading circuit 41, a burn-in mode signal BURN-IN, and a test mode signal TESTA, and then supplies the current limitation signal CSB to each of the QCR type input circuits QCR1 to QCRn (30) and the internal power supply circuit 20. The internal power supply circuit 20 receives the reference voltage VPERIR, the current limitation signal CSB, and a second activation control signal EN2T, thereby generating a power supply voltage VPERI necessary for operation of an internal circuit. As an internal circuit of the internal power supply circuit 20, the internal power supply circuit (of the transistors MP2, MP3, MP1, MN2, MN3, MN1, and MN6, and the differential circuit 21 in FIG. 8, for example) shown in FIG. 8 or 9 is employed.

A command decoder 65 receives and decodes the command signal from each of the QCR type input circuits QCR1 to QCRn (30), thereby generating various control signals necessary for internal operation of the semiconductor device 10e. A column address decoder 62 receives and decodes column addresses from the respective QCR type input circuits QCR1 to QCRn (30) to specify a column address in a memory cell array 64. A row address decoder 63 receives and decodes row addresses from the respective QCR type input circuits QCR1 to QCRn (30) to specify a row address in the memory cell array 64. In the memory cell array 64, memory cells are arranged in a matrix form. A memory cell is specified based on the addresses specified by the column address decoder 62 and the row address decoder 63. A read or a write is thereby performed. Data in the memory cell array 64 for which the read or the write is performed is supplied to or output from a DQ terminal through a read/write circuit not shown.

A ring oscillator 67 is activated by a test mode signal TESTB and outputs an oscillation signal from a TEST1 terminal. An oscillation frequency of the ring oscillator 67 can be determined based on a logic of the signal output from the TEST1 terminal at a time of a test, and current consumption during burn-in can also be predicted, based on the oscillation frequency, for example.

The semiconductor device 10e in the fifth exemplary embodiment includes the QCR type input circuits QCR1 to QCRn (30) in the first or second exemplary embodiment and the internal power supply circuit 20 in the third or fourth embodiment. Thus, excessive current consumption during the burn-in can be prevented. Further, it can be set that unnecessary current limitation is not performed for a semiconductor device whose current consumption varies to be small and for which current consumption limitation during the burn-in is not therefore needed. Accordingly, unnecessary current limitation is not performed during the burn-in, so that a screening effect is not weakened.

Sixth Exemplary Embodiment

Figure 12:
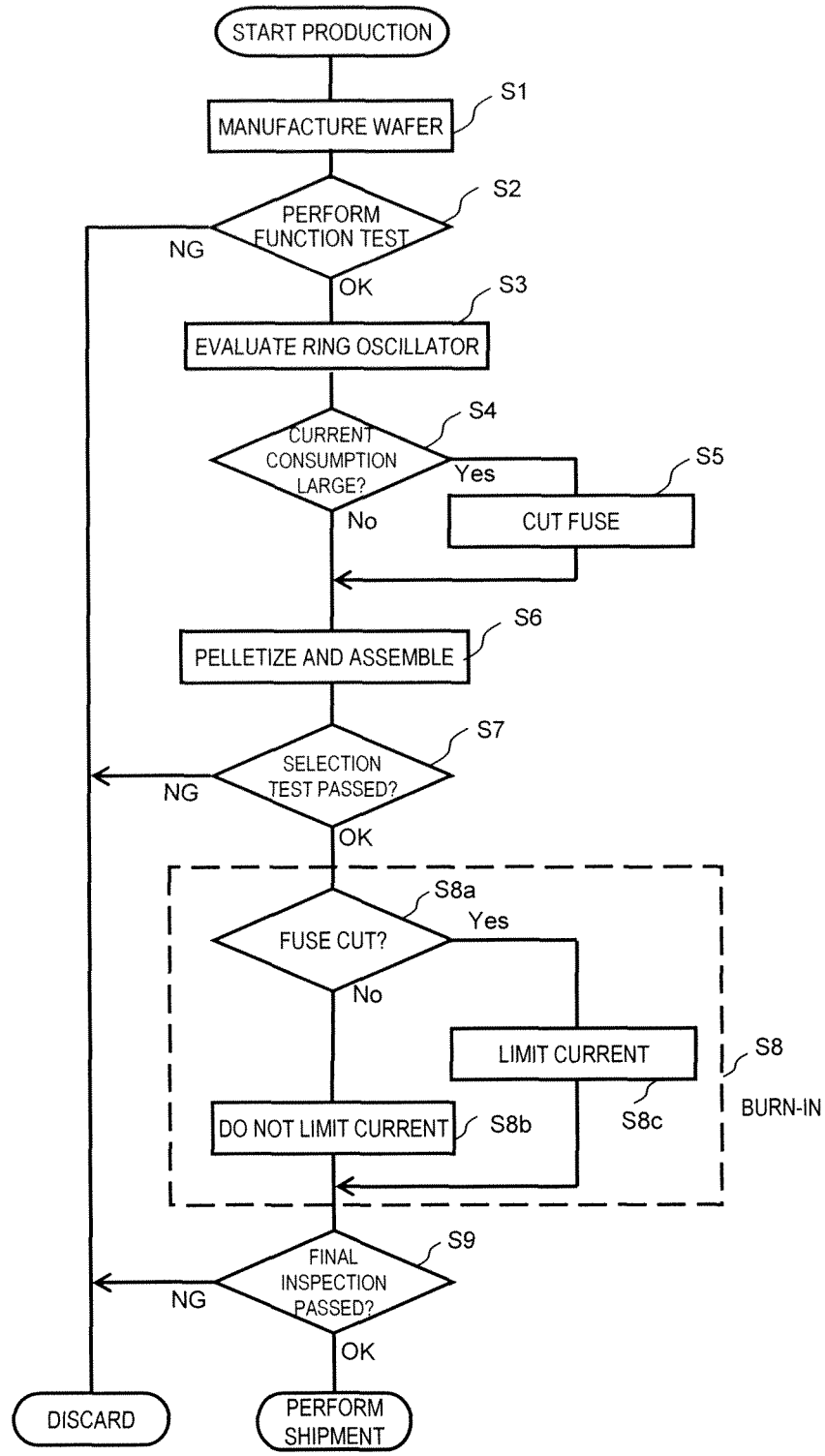
FIG. 12 is a flowchart showing a production method of a semiconductor device in a sixth exemplary embodiment.

FIG. 12 shows a flowchart of a production method of a semiconductor device in a sixth exemplary embodiment. The sixth exemplary embodiment is the one showing the production method of the semiconductor device in one of the first to fifth exemplary embodiments. The flowchart in FIG. 12 will be explained step by step. In step S1, a circuit pattern of each semiconductor device in the one of the first to fifth embodiments is created on the surface of a semiconductor substrate of a semiconductor wafer. In step S2, functions of semiconductor devices in a wafer state are tested. This process is generally referred to as a P/W process. A semiconductor device, which has been evaluated to be defective in the function test and cannot be rescued even if a redundancy circuit is used, is discarded.

This function test includes a test for predicting current consumption of each semiconductor device during burn-in, such as evaluation of the ring oscillator 67 (refer to FIG. 11)

(in step S3). A fuse for a product which has been evaluated to be good but whose current consumption varies to be large in this evaluation of the current consumption is cut (in step S5). A fuse for a product whose current consumption does not vary to increase is not cut. When the function test (P/W process) and the fuse cutting process are finished, a manufacturing process of the semiconductor wafer is finished. Then, the wafer is divided into pellets for the respective semiconductor devices, and semiconductor pellets obtained by the division are incorporated into semiconductor packages (in step S6). A selection test is performed for the semiconductor devices for which assembly has been finished, as necessary, and a defective product which has been rejected due to defective assembly is discarded (in step S7).

The burn-in is performed for the semiconductor device that has passed the selection test (in step S7), and is then screened (in step S8). An initial defect which has not been evaluated to be defective in the selection test can be found by this burn-in. In the burn-in, a clock is supplied from the burn-in apparatus 101 (refer to FIG. 2) to the semiconductor device mounted on each socket 110 through the burn-in board 102. Then, each semiconductor device reads the state of the fuse through the reading circuit 41. The current limitation circuit (51, 52 or 56) determines the fuse state, and determines whether or not current consumption limitation during the burn-in is performed (in step S8a). When the fuse is not cut, the burn-in is executed without performing current limitation (in step S8b). When the fuse is cut, the burn-in is executed with the current limitation performed (in step S8c).

After the burn-in has been finished, a final inspection is performed (in step S9). When an initial defect has occurred as a result of the burn-in, the sample having the initial defect is regarded to be defective and is then discarded. When an initial defect has not occurred in the final inspection after the burn-in, the sample without the initial defect is shipped as a good product.

According to the semiconductor device production method in the sixth exemplary embodiment, it is determined whether or not current consumption during the burn-in is limited, based on a result of the test before the burn-in. Accordingly, only when the current consumption limitation during the burn-in is necessary, the current limitation can be performed. In the sixth exemplary embodiment, data indicating whether or not to perform the current consumption limitation in the burn-in process is stored in each fuse. Then, at a time of the burn-in, the data in the fuse is read to perform the current consumption limitation. The fuse is an example of a non-volatile memory, and the data may be stored in a semiconductor non-volatile memory or the like such as a flash memory, in place of the fuse. Alternatively, the result of the test can be recorded in a memory or the like outside each semiconductor device, and it can also be determined whether or not current consumption limitation is performed in the burn-in process, based on the record of the result of the test.

Seventh Exemplary Embodiment

FIG. 14 is a block diagram of circuits in the vicinity of a QCR type input initial stage circuit in a semiconductor device according to a seventh exemplary embodiment. A configuration of a semiconductor device 10f in the seventh exemplary embodiment will be described, using FIG. 14. Same reference numerals are assigned to components that are the same as those in the first and second exemplary embodiments shown in FIGS. 1, 6, and 7, thereby omitting duplicate explanation of the same components.

A NAND circuit 72 receives an activation control signal ENT for the differential circuit 31 and an inverted signal of a burn-in mode signal BURN-IN to control turning on or off of the PMOS transistor MP1 and the NMOS transistor MN1 which are power supply circuits for the differential circuit (differential type input circuit) 31.

A NAND circuit 75 receives an input signal PIN supplied from an external input terminal (not shown) and the burn-in mode signal BURN-IN, takes a NAND logic of the input signal PIN and the burn-in mode signal BURN-IN, and then outputs the resulting signal. When the burn-in mode signal BURN-IN is active high, the NAND circuit 75 functions as an input circuit of a ratio type that takes in the input signal PIN supplied from an outside. That is, the input signal PIN is connected to gates of a PMOS transistor and an NMOS transistor in an inside (not shown) of the NAND circuit 75 that is a CMOS circuit. Then, the NAND circuit 75 functions as the input circuit of the ratio type whose operating point is determined by a resistance ratio between the PMOS transistor and the NMOS transistor.

A NAND circuit 76 receives an output signal PIN3T of an inverter 32 and an output signal of the NAND circuit 75, takes a NAND logic of the output signal PIN3T and the output signal of the NAND circuit 75, and outputs an OUT_B signal that is an output signal of the entire QCR type input initial stage circuit. The NAND circuit 75 and the NAND circuit 76 function as an output selection circuit that selects whether an output signal PIN2B of the differential circuit 31 is output as the OUT_B signal or a portion of the NAND circuit 75 is functioned as the input circuit of the ratio type and the input signal PIN is directly output as the OUT_B signal.

A source of an NMOS transistor MN15 is connected to a power source VSS, a drain of the NMOS transistor MN15 is connected to the output signal PIN2B of the differential circuit (differential type input circuit) 31, and a gate of the NMOS transistor MN15 is connected to an output of the NAND circuit 72. A signal different from that connected to a gate of the NMOS transistor MN15 in FIG. 7 is connected to the gate of an NMOS transistor MN15 in FIG. 14. However, the signal connected to the gate of the NMOS transistor MN15 in FIG. 7 and the signal connected to the gate of the NMOS transistor MN15 in FIG. 14 have a same function of fixing the output signal PIN2B of the differential circuit 31 at low when power supply to the differential circuit 31 is stopped.

Next, operation of the seventh exemplary embodiment shown in FIG. 14 will be described. During periods (including a period when a normal operation is performed) other than that in the burn-in mode, the burn-in mode signal BURN-IN is fixed to be inactive (low level). Then, the PMOS transistors MP1 and the NMOS transistor MN1, which are the power supply circuits for the differential circuit 31, are both controlled to be turned on or off according to the activation control signal ENT of the differential circuit 31. That is, when the activation control signal ENT is active (high level), each of the PMOS transistor MP1 and the NMOS transistor MN1 is turned on, thereby supplying power to the differential circuit 31. When the activation control signal ENT is inactive (low level), each of the PMOS transistor MP1 and the NMOS transistor MN1 is turned off, thereby stopping supply of the power to the differential circuit 31.

When the burn-in mode signal BURN-IN is inactive (low level), an output of the inverter 73 is fixed at a low level. Thus, an output of the NAND circuit 75 is fixed at a high level. The NAND circuit 76 inverts the signal PIN3T, which is an output signal of the differential circuit 31 and outputs the inverted output signal PIN3T as the output signal OUT_B.

Next, the burn-in mode signal BURN-IN is fixed to be active (high level) in the burn-in mode. An output of the NAND circuit 72 then goes high and an output of an inverter 74 goes low. Each of the PMOS transistor MP1 and the NMOS transistor MN1, which are the power supply circuits for the differential circuit 31, is fixed to be turned off, thereby being controlled so that power supply current is not flown to the differential circuit 31. Further, the output signal PIN2B of the differential circuit 31 is fixed at the low level by the NMOS transistor MN15, which is a pull-down transistor, and the signal PIN3T is fixed at a high level. Since an output signal of the inverter 73 is fixed at the high level, the NAND circuit 75 functions as the input circuit of the ratio type that directly receives the input signal PIN. Thus, the NAND circuit 75 outputs the normal rotation signal of the input signal PIN as the output signal OUT_B.

In the circuit in FIG. 14, a logic of the output signal OUT_B with respect to a logic of the input signal PIN is inverted in the non-burn-in mode (other than the burn-in mode), and is non-inverted in the burn-in mode. When the logic in the burn-in mode is inverted for output, as in the non-burn-in mode, one inverter should be added between an input of the signal PIN and the NAND circuit 75, thereby causing the added inverter to function as an input circuit of a ratio type.

In the semiconductor device in each of the first to fifth exemplary embodiments, when the differential circuit is used as the input circuit, it is necessary to provide power supplies to the differential circuit in the burn-in mode as well in order to cause the differential circuit to function as the input circuit. In the seventh exemplary embodiment, however, a portion of the test circuit is functioned as the input circuit of the ratio type in place of the differential circuit to taken in the input signal. Thus, provision of the power supplies to the differential circuit can be completely stopped.

When the input circuit of the ratio type is used in place of the differential type input circuit, there cannot be expected performance in terms of an operating speed and the like which is equivalent to that when the differential type input circuit is used. However, the entire semiconductor device should be operated in a burn-in test, and it is not always necessary to operate the semiconductor device at an upper limit of the operating speed. Thus, no problem will arise.

Eighth Exemplary Embodiment

When the activation control signal ENT is inactive (low level) in the non-burn-in mode in the QCR type input initial stage circuit in the seventh exemplary embodiment shown in FIG. 14, the output signal OUT_B is fixed at a low level. On the other hand, when an activation control signal ENT is inactive in the non-burn-in mode in a QCR type input initial stage circuit in an eighth exemplary embodiment, an output signal OUT_B is fixed at a high level.

Figure 15B:
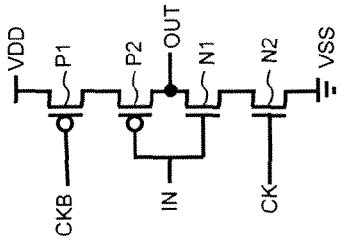
FIG. 15B is an internal circuit diagram of each clocked inverter of the QCR type input initial stage circuit.

FIG. 15A is a block diagram of circuits in the vicinity of the QCR type input initial stage circuit in the eighth exemplary embodiment. FIG. 15B is an internal circuit diagram of each clocked inverter used for the circuit in FIG. 15A. A configuration of a semiconductor device 10g in the eighth exemplary embodiment will be described, using FIG. 15. Same reference numerals are assigned to components that are substantially the same as those in the QCR type input circuit in the seventh exemplary embodiment shown in FIG. 14. Duplicate description of such components will be thereby omitted The QCR type input initial stage circuit shown in FIG. 15A includes clocked inverters 82 and 83 and an inverted output buffer 84 that select one of an input signal PIN directly supplied from an external terminal and an output signal PIN2B of the differential circuit 31, for output. These clocked inverters 82 and 83 and the inverted output buffer 84 switch between output of the output signal of the differential circuit 31 as the output signal OUT_B and direct output of the input signal PIN received from an input terminal as the output signal OUT_B, according to a logic level of a burn-in-mode signal BURN-IN.

That is, when the burn-in-mode signal BURN-IN is inactive (low level), the clocked inverter 83 becomes active, and the clocked invert 82 becomes inactive. Then, the inverted output buffer 84 outputs an output signal in phase with the output signal PIN2B of the differential circuit 31 as the output signal OUT_B. On the other hand, when the burn-in-mode signal BURN-IN is active (high level), the clocked inverter 82 becomes active, and the clocked inverter 83 becomes inactive. The clocked inverter 82 thereby functions as an input circuit of a ratio type that takes in the external input signal PIN. The inverted output buffer thereby outputs an output signal in phase with the external input signal PIN as the output signal OUT_B.

A PMOS transistor MP15 with a source thereof connected to a power source VDD, a drain thereof connected to the output signal PIN2B, and a gate thereof connected to an output of the inverter 74 is provided between the power source VDD and the output signal PIN2B. This PMOS transistor causes an output signal of the NAND circuit 72 to go high when the activation control signal ENT is inactive (low level) or the burn-in mode signal BURN-IN is active (high level). Then, when power supply to the differential circuit 31 is stopped, a logic level of the output signal PIN2B is fixed at a high level.

An internal circuit of each of the clocked inverters 82 and 83 in FIG. 15A is shown in FIG. 15B. When a clock signal CK is inactive low (when a clock signal CKB is high), a PMOS transistor P1 and an NMOS transistor N2 both turn off. Thus, an output becomes a high-impedance state, irrespective of a level of a signal supplied from an input terminal IN. On the other hand, when the clock signal CK is active high (when the clock signal CKB is low), the PMOS transistor P1 and the NMOS transistor N2 both turn on, thereby inverting the logic level of the signal supplied from the input terminal IN to be output from an output terminal OUT. The clocked inverter 82 in particular functions as a ratio circuit in which a voltage level at the output terminal OUT is determined by a voltage level of the input signal PIN and a resistance ratio between the PMOS transistor P2 and the NMOS transistor N1.

Next, operation of the semiconductor device 10g in the eighth exemplary embodiment shown in FIG. 15 will be explained. When not in the burn-in mode (including a period when a normal operation is performed), the burn-in mode signal BURN-IN is fixed to be inactive (low level). Then, turning on or off of both of the PMOS transistor MP1 and the NMOS transistor MN1 that will become power supply circuits to the differential circuit 31 is controlled by the activation control signal ENT for the differential circuit 31. That is, when the activation control signal ENT is active (high level), the PMOS transistor MP1 and the NMOS transistor MN1 both turn on to supply powers to the differential circuit 31. When the activation control signal ENT is inactive (low), the PMOS transistor MP1 and the NMOS transistor MN1 turn off, thereby stopping supply of the powers to the differential circuit 31. When the activation control signal ENT is inactive (low level), the PMOS transistor MP15 turns on, thereby fixing the output signal PIN2B of the differential circuit 31 at the high level.

Further, the clocked inverter 83 turns on, and the clocked inverter 82 turns off. Thus, the signal in phase with the output signal PIN2B of the differential circuit is output as the output signal OUT_B.

Next, in the burn-in mode, the burn-in mode signal BURN-IN is fixed to be active (high level). Then, the output of the NAND circuit 72 goes high, and the output of the inverter 74 goes low. Each of the PMOS transistor MP1 and the NMOS transistor MN1, which are the power supply circuits for the differential circuit 31, is fixed to be turned off, thereby being controlled so that power supply current is not flown to the differential circuit 31. Further, the output signal PIN2B of the differential circuit 31 is fixed at the high level by the PMOS transistor MP15, which will become a pull-up transistor. Further, the clocked inverter 82 turns on, and the clocked invert 83 turns off. Thus, the clocked inverter 82 functions as the input circuit of the ratio type that inverts and outputs the input signal PIN, so that the output signal OUT_B of a level in phase with the input signal PIN is output from the inverted output buffer 84.

The eighth exemplary embodiment is different from the seventh exemplary embodiment in the following respects. In the semiconductor device 10*f* in the seventh exemplary embodiment shown in FIG. 14, the output signal OUT_B is fixed at the low level when the activation control signal ENT becomes inactive (low level) in the non-burn-in mode. On contrast therewith, in the eighth exemplary embodiment, the output signal OUT_B is fixed at the high level when the activation control signal ENT is inactive in the non-burn-in mode. Further, the NAND circuits 75 and 76, which are combinational logic circuits, switch whether to use the differential circuit or the ratio circuit as the input circuit for the input signal PIN, according to the logic level of the burn-in mode signal, in the seventh exemplary embodiment. On contrast therewith, in the eighth exemplary embodiment, clocked-gates or the clocked inverters 82 and 83 and the inverted output buffer 84 switches whether to use the differential circuit or the ratio circuit as the input circuit for the input signal PIN. In both of the seventh and eighth exemplary embodiments, current that will flow through the differential circuit 31 in the burn-in mode can be stopped. Accordingly, current that will flow through the QCR-type input initial stage circuit during burn-in can be reduced. The input circuit in the seventh exemplary embodiment and the input circuit in the eighth embodiment can be switched for use according to the need to fix the output signal OUT_B at the high level or at the low level when the activation control signal ENT is inactive.

Ninth Exemplary Embodiment

Figure 16:
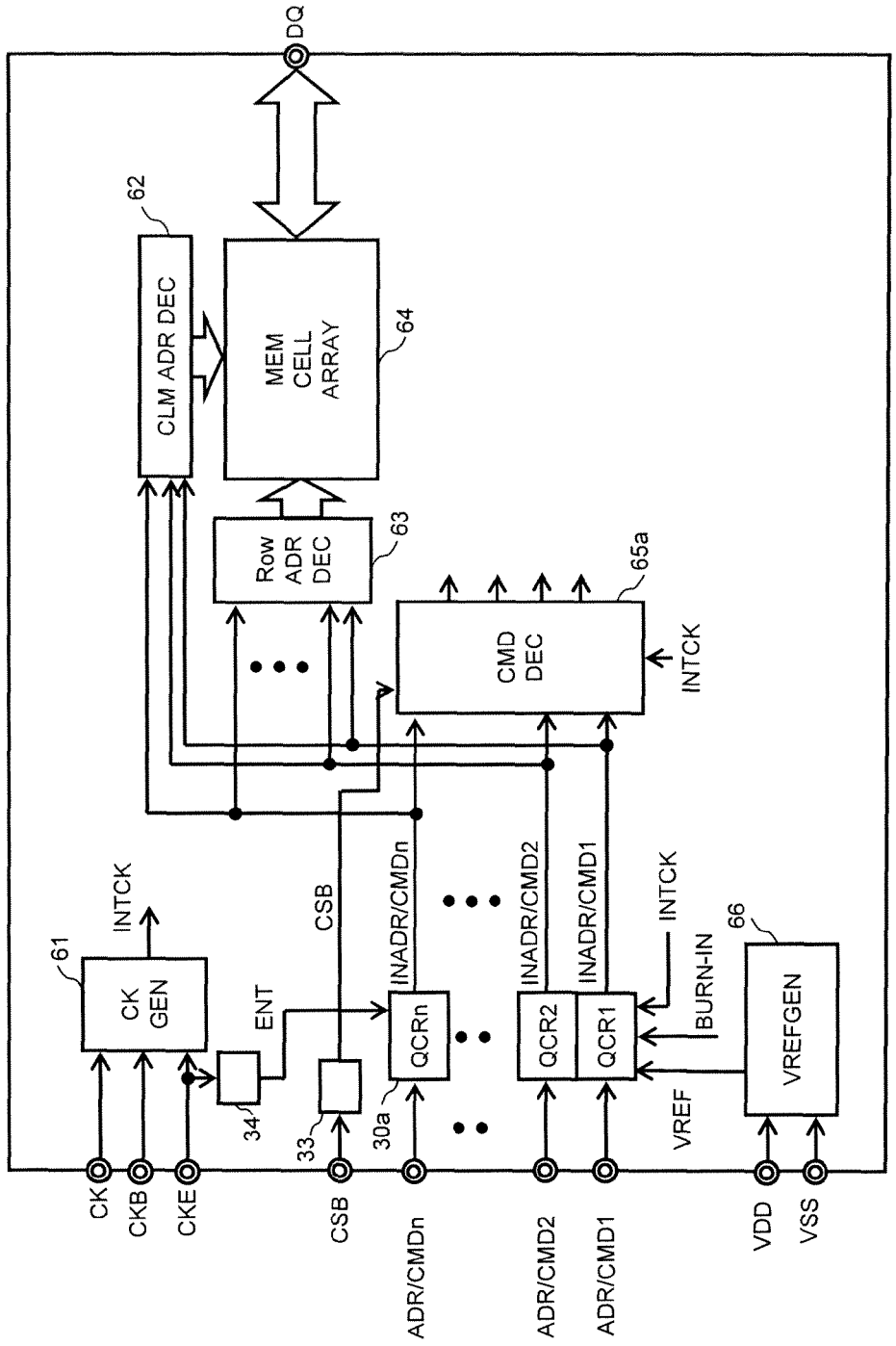
FIG. 16 is a block diagram of an entire semiconductor device in a ninth exemplary embodiment.

In a ninth exemplary embodiment shown in FIG. 16, the QCR type input initial stage circuit disclosed in the seventh or eighth embodiment is used for a circuit for receiving an address signal and/or a command signal in a semiconductor device 10*h*, which is a synchronous memory. Specifically, the semiconductor device 10*h* is a DDRSDRAM. FIG. 16 is a block diagram of an entirety of the DDRSDRAM (semiconductor device 10*h*) in the ninth exemplary embodiment. Same reference numerals are assigned to components that are the same as those in the synchronous semiconductor memory device (semiconductor device 10*e*) in the fifth exemplary embodiment shown in FIG. 11.

Referring to FIG. 16, reference character CK indicates a clock input terminal, reference character CKB indicates an inverted clock input terminal, and reference character CKE indicates a clock enable signal input terminal. When a clock enable signal CKE received from the clock enable signal input terminal is active (high level), the clock generator 61 generates an internal clock signal INTCK in synchronization with clock signals supplied from the clock input terminal CK and the inverted clock input terminal CKB, and supplies the internal clock signal INTCK to an inside of the semiconductor device 10*h*. The clock generator 61 stops generation of the internal clock signal INTCK based on clock signals CK and CKB supplied from an outside when the clock enable signal CKE is inactive (low level). The clock enable signal CKE is connected to a power-down mode control circuit 34. The power-down mode control circuit 34 outputs an activation control signal ENT to control a power-down mode of the entire semiconductor device 10*h*, based on a logic of the clock enable signal CKE. When the clock enable signal CKE is active (high level), the power-down mode control circuit 34 sets the activation control signal ENT to be active (high level), thereby setting the semiconductor device 10*h* to be in a non-power-down mode. When the clock enable signal CKE is inactive (low level), the power-down mode control circuit 34 sets the activation control signal ENT to be inactive (low level), thereby setting the semiconductor device 10*h* to be in the power-down mode.

The ADR/CMD1 to ADR/CMDn terminals are the terminals to which address signals and/or command signals given from the outside are supplied. The number of the terminals n is an arbitrary integer being two or more, determined by product specifications. QCR type input circuits QCR1 to QCRn (30*a*) are respectively provided corresponding to the ADR/CMD1 to ADR/CMDn terminals, and are circuits that receive the address signals and/or the command signals given from the ADR/CMD1 to ADR/CMDn terminals. The QCR input initial stage circuit in the seventh exemplary embodiment or the eighth exemplary embodiment described using FIG. 14, or FIG. 15 is used for an initial stage of each of the QCR type input circuits QCR1 to QCRn (30*a*). As will be described later, it is preferable that the QCR type input initial stage circuit in the eighth exemplary embodiment shown in FIG. 15 for fixing an output signal OUT_B at a high level when the activation control signal ENT is inactive be used for the terminal for receiving the command signal. However, the QCR type input initial stage circuit in the seventh exemplary embodiment can also be used for the terminal for receiving only the address signal.

A reference voltage VREF, the activation control signal ENT, and a burn-in mode signal BURN-IN are supplied to each of the QCR type input circuits QCR1 to QCRn (30*a*) to control each input initial stage circuit. A register that temporarily holds the address signal and/or the command signal as necessary in synchronization with the internal clock signal INTCK generated by the clock generator 61 is provided for a subsequent stage inside each of the QCR type input circuits QCR1 to QCRn (30*a*).

Reference characters VDD and VSS respectively indicate terminals of power supplies provided to the semiconductor device 10*h* from the outside. A higher voltage than that for the VSS terminal is supplied to the VDD terminal. The reference voltage generation circuit 66 generates voltages necessary for the inside of the semiconductor device 10*h* from power supplies VDD and VSS provided from the outside. The reference voltage VREF generated by the reference voltage generation circuit 66 is supplied to each of the QCR type input circuits QCR1 to QCRn (30*a*).

A CSB input circuit 33 is an input buffer circuit for a CSB terminal, and receives an inverted chip select signal CSB from the CSB terminal. The inverted chip select signal CSB (in FIG. 16) in the ninth exemplary embodiment is a signal different from the current limitation signal CSB in FIG. 1 (in the first exemplary embodiment) and FIG. 8 (in the third exemplary embodiment). A command decoder 65a decodes the command signal received from each of the QCR type input circuits QCR1 to QCRn (30a) and the inverted chip select signal CSB received from the CSB terminal, in synchronization with the internal clock signal INTCK, and generates various control signals necessary for internal operation of the semiconductor device 10h.

Figure 17A:
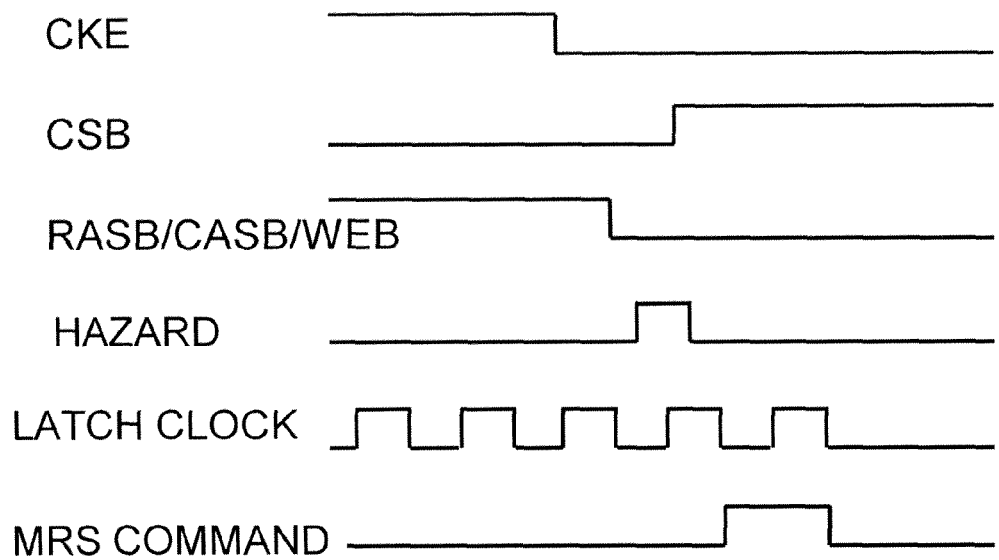
FIG. 17A is a timing chart when the QCR type input initial stage circuit shown in FIG. 14 is used for a command input terminal in the semiconductor device in the ninth exemplary embodiment.
Figure 17B:
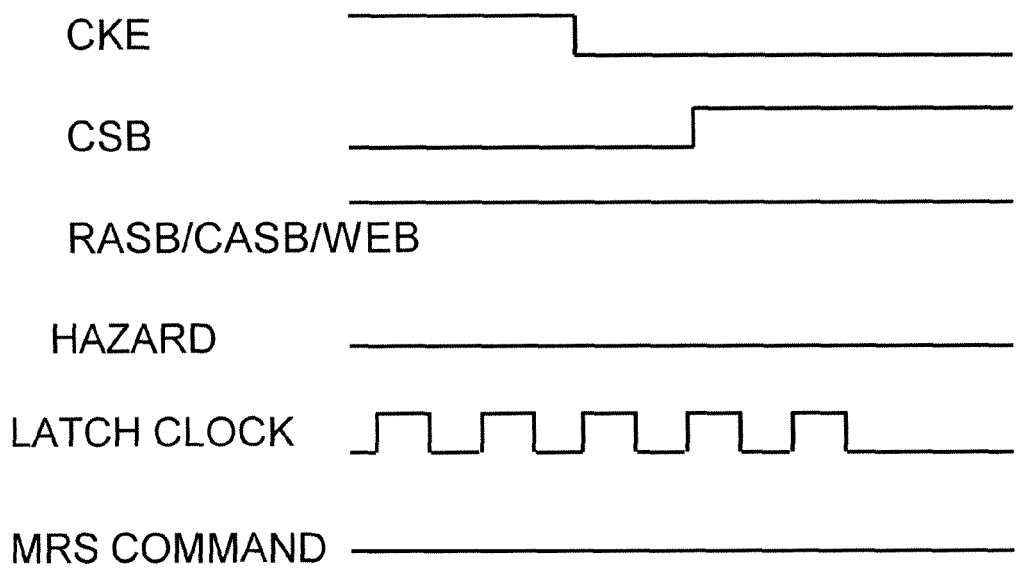
FIG. 17B is a timing chart when the QCR type input initial stage circuit shown in FIG. 15 is used for the command input terminal in the semiconductor device in the ninth exemplary embodiment.

Preferably, the input initial stage circuit as shown in FIG. 15 for fixing the output signal OUT_B at the high level at a time of power-down when the activation control signal ENT becomes inactive is used for the input circuit for receiving the command signal such as a signal RASB, a signal CASB, or a signal WEB, among the QCR type input circuits QCR1 to QCRn (30a). The reason for that will be described. FIG. 17A and FIG. 17B show timing charts respectively showing a case where the input initial stage circuit for fixing the output signal OUT_B at the high level at the time of power-down when the activation control signal ENT becomes inactive in the non-burn-in mode is used for the input circuit for the command signal such as the signal RASB, the signal CASB, or the signal WEB and a case where the input initial stage circuit for fixing the output signal OUT_B at a low level at the time of power-down is used for the input circuit for the command signal such as the signal RASB, the signal CASB, or the signal WEB. Specifically, FIG. 17A is a timing chart when the input initial stage circuit for fixing the output signal OUT_B at the low level (refer to the input initial stage circuit in the seventh exemplary embodiment shown in FIG. 14, for example) is used. FIG. 17B is a timing chart when the input initial stage circuit for fixing the output signal OUT_B at the high level (refer to the input initial stage circuit in the eighth exemplary embodiment shown in FIG. 15, for example) is used.

Referring to FIG. 17A, reference character CKE indicates the clock enable signal received from the clock enable signal terminal, reference character CSB indicates the inverted chip select signal received from the CSB terminal, reference characters RASB, CASB, and WEB respectively indicate an internal row address strobe signal, an inverted column address strobe signal, and an inverted write enable signal (all of which are the command signals) output from the QCR type input circuits QCR1 to QCRn (30a) respectively corresponding to the ADR/CMD1 to ADR/CMDn terminals. Each of the signals RASB, CASB, and WEB in FIG. 17A corresponds to the OUT_B signal in FIG. 14. FIG. 17A is the timing chart in the non-burn-in mode. When the clock enable signal CKE falls, the semiconductor device becomes the power-down mode, so that the activation control signal ENT becomes inactive (low level). Then, each of the signals RASB, CASB, and WEB corresponding to the OUT_B signal in FIG. 14 is fixed at a low level. Referring to FIG. 17A, before the signal CKE falls and then the semiconductor device becomes the power-down mode, each of the signals RASB, CASB, and WEB is high. Thus, each of the signals RASB, CASB, and WEB falls by the fall of the signal CKE and entry of the semiconductor mode into the power-down mode. Further, when the clock signal CKE is fallen to set the semiconductor device to be in the power-down mode, a level at the CSB terminal is raised to set the semiconductor device 10h from a chip select state to a non-chip select state.

FIG. 17A shows a case where a rise of the signal CSB is delayed from a fall of each of the signals RASB, CASB, and WEB. When the rise of the signal CSB is delayed as shown in FIG. 17A, a "hazard" occurs in an input signal of the command decoder 65a (in FIG. 16). Then, the command decoder 65a latches an MRS command in synchronization with the internal clock signal INTCLK output from the clock generator 61 (in FIG. 16) that will become a "latch clock" for the command decoder 65a. Since the clock enable signal CKE is fallen to set the semiconductor device to be in the power-down mode, the MRS command should not have been originally output. Thus, a malfunction may be caused.

FIG. 17B, on the other hand, is the timing chart when the input initial stage circuit for fixing the output signal OUT_B at the high level is used as the input initial stage circuit for each of the signals RASB, CASB, and WEB. When the clock enable signal CKE is fallen to set the semiconductor device to be in the power-down mode, and then the activation control signal ENT is fallen, the output signal OUT_B of the input initial stage circuit is fixed at the high level. Thus, each of the signals RASB, CASB, and WEB is kept high. Accordingly, even if the rise of the CSB signal is delayed when the clock enable signal CKE is fallen to set the semiconductor device to be in the power-down mode, it is not likely a hazard will be output and then it is not likely that the erroneous command will be latched.

That is, preferably, for at least the input initial stage circuit for receiving each of the command signals RASB, CASB, and WEB, the circuit as shown in FIG. 15 for fixing the output signal OUT_B at the high level when the activation control signal ENT goes low in the non-burn-in mode is used, rather than the circuit as shown in FIG. 14 for fixing the output signal OUT_B at the low level.

Figure 18:
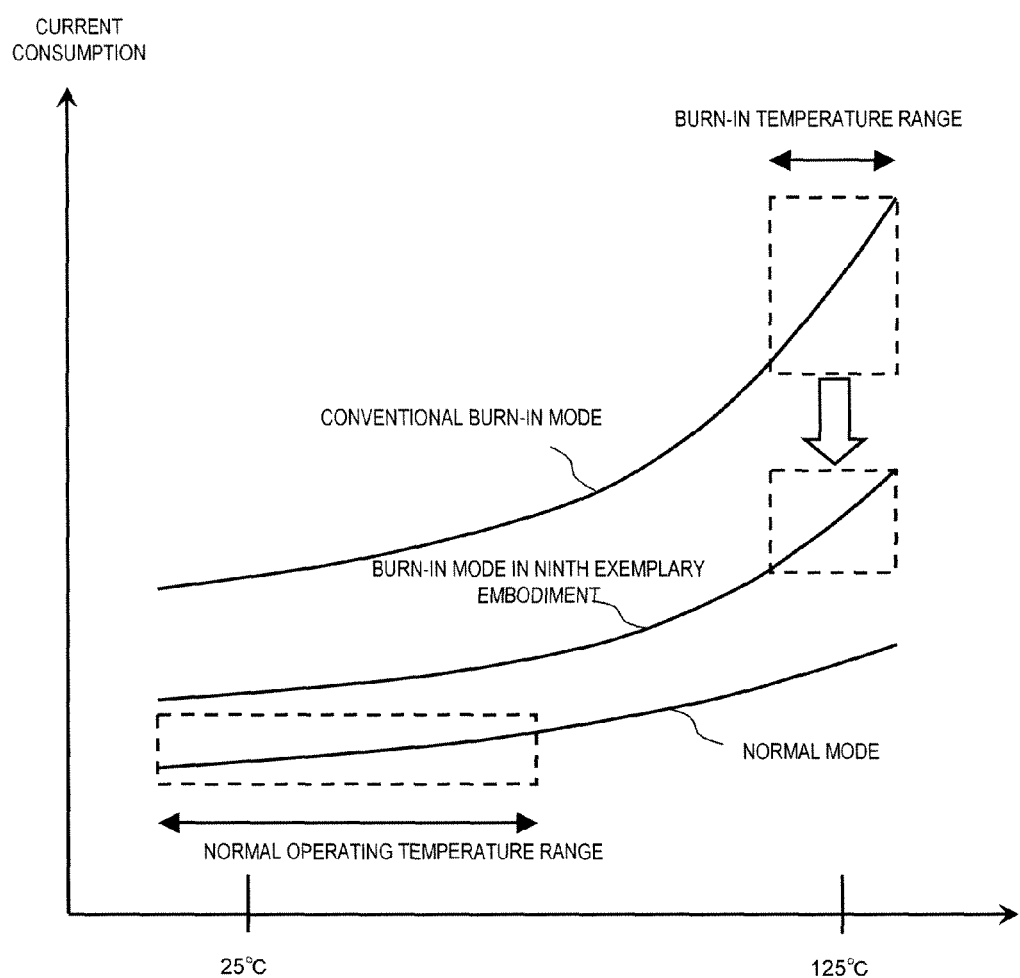
FIG. 18 is a graph showing comparison among current consumption in the conventional burn-in mode, current consumption in a burn-in mode in the ninth exemplary embodiment, and current consumption in the normal mode.

Next, an effect when the input initial stage circuit shown in FIG. 15 is used for each of the QCR type input circuits QCR1 to QCRn (30a) in the ninth exemplary embodiment will be described. FIG. 18 is a graph showing comparison among current consumption in a conventional burn-in mode, current consumption in a burn-in mode in the ninth exemplary embodiment, and current consumption in a normal mode. In the conventional burn-in mode in FIG. 18, the input initial stage circuit in FIG. 15 is not used for each of the QCR input circuits QCR1 to QCRn (30a) in FIG. 16, and the conventional input initial stage circuit shown in FIG. 5 is used.

A horizontal axis in FIG. 18 indicates ambient temperature, and a vertical axis indicates current consumption. While a normal operating temperature range in the normal mode is an ambient temperature from 0 to 85° C. a burn-in temperature range is in the vicinity of 125° C. According to the ninth exemplary embodiment, maximum current consumption in the burn-in mode can be reduced more than that in the conventional burn-in mode, as shown in FIG. 18. It is because, in the burn-in mode, power supply to the differential input circuit of the QCR type input initial stage circuit is stopped, and the input circuit of the ratio type is used in place of the differential input circuit. There is no significant difference of current consumption in the normal mode between when the conventional input initial stage circuit is used and when the input initial stage circuit in FIG. 15 is used.

The following modes of the present invention can also be implemented.

(First Mode)

A semiconductor device comprising:
    a differential circuit;
    a power supply circuit that provides a power supply to the differential circuit; and
    a current limitation circuit that receives a burn-in mode signal and a first control signal, and generates a current limitation signal for limiting current to be supplied to the differential circuit by the power supply circuit when the burn-in mode signal and the first control signal are both active.

(Second Mode)
The semiconductor device as set forth in the first mode, wherein
the power supply circuit receives an activation control signal and provides the power supply to the differential circuit when the activation control signal is at an active level, and stops the power supply to the differential circuit when the activation control signal is at an inactive level.

(Third Mode)
The semiconductor device as set forth in the second mode, wherein
the power supply circuit comprises:
a power supply circuit that supplies power to the differential circuit when the activation control signal is active, and stops supply of the power to the differential circuit when the activation control signal is inactive, irrespective of a logic level of the current limitation signal; and
a power supply circuit that supplies power to the differential circuit when the current limitation signal is inactive and the activation control signal is active, and stops supply of the power to the differential circuit when the current limitation signal is active or the activation control signal is inactive.

(Fourth Mode)
The semiconductor device as set forth in the second mode, wherein
the power supply circuit comprises:
first and second power supply circuits connected to a first power source; and
third and fourth power supply circuits connected to a second power source;
the first power supply circuit supplies power to the differential circuit from the first power source when the activation control signal is active, and stops supply of the power to the differential circuit when the activation control signal is inactive, irrespective of a logic level of the current limitation signal;
the second power supply circuit supplies power to the differential circuit from the first power source, in parallel with the first power supply circuit, when the current limitation signal is inactive and the activation control signal is active, and stops supply of the power to the differential circuit when the current limitation signal is active or the activation control signal is inactive;
the third power supply circuit supplies power to the differential circuit from the second power source when the activation control signal is active, and stops supply of the power to the differential circuit when the activation control signal is inactive, irrespective of the logic level of the current limitation signal; and
the fourth power supply circuit supplies power to the differential circuit from the second power source, in parallel with the third power supply circuit, when the current limitation signal is inactive and the activation control signal is active, and stops supply of the power to the differential circuit when the current limitation signal is active or the activation control signal is inactive.

(Fifth Mode)
The semiconductor device as set forth in the fourth mode, wherein
the semiconductor device further includes a non-volatile memory and a reading circuit for the non-voltage memory; and
the current limitation circuit comprises:
a first combinational logic circuit that combines a logic of the non-volatile memory read by the reading circuit and a test mode signal to generate the first control signal; and
a second combinational logic circuit that generates the current limitation signal from the first control signal and the burn-in mode signal.

(Sixth Mode)
The semiconductor device as set forth in the fourth or fifth mode, wherein
the current limitation circuit further includes a third combinational logic circuit that combines the current limitation signal and the activation control signal to control turning on/off of the second and fourth power supply circuits;
each of the first and third power supply circuits comprises a power supply transistor that is controlled to be turned on/off by the activation control signal; and
each of the second and fourth power supply circuits comprises a power supply transistor that is controlled to be turned on/off by an output of the third combinational logic circuit.

(Seventh Mode)
The semiconductor device as set forth in the fourth or fifth mode, wherein
each of the first and third power supply circuits comprises a power supply transistor that is controlled to be turned on/off by the activation control signal; and
each of the second and fourth power supply circuits comprises a first power supply transistor that is controlled to be turned on/off by the activation control signal and a second power supply transistor having a current path thereof connected in series with the first power supply transistor, the second power supply transistor being controlled to be turned on/off by the current limitation signal, power being supplied to the differential circuit from each of the first and second power sources when the first and second power supply transistors are both controlled to be turned on.

(Eighth Mode)
The semiconductor device as set forth in any one of the fourth to seventh modes, wherein
the differential circuit comprises:
a first differential pair connected to the third and fourth power supply circuits, a reference voltage being supplied to one of differential inputs of the first differential pair and an input signal being connected to the other of the differential inputs; and
a first load circuit connected between the first differential pair and the first and second power supply circuits; and
an output signal is taken out from a connecting point between the first differential pair and the first load circuit.

(Ninth Mode)
The semiconductor device as set forth in the eighth mode, wherein
the differential circuit comprises:
a second differential pair connected to the first and second power supply circuits, the reference voltage being supplied to one of differential inputs of the second differential pair and the input signal being connected to the other of the differential inputs; and
a second load circuit connected between the second differential pair and the third and fourth power supply circuits; and
a pair of connecting points between the second differential pair and the second load circuit is also connected to each of the first differential pair and the first load circuit.

(Tenth Mode)
The semiconductor device as set forth in the ninth mode, wherein
an external input signal received from an external connection terminal is connected to the differential circuit as the input signal, and the differential circuit compares a voltage level of the external input signal with the reference voltage when the activation control signal is at the active level, and then outputs a result of the comparison as the output signal.

(Eleventh Mode)
The semiconductor device as set forth in the eighth mode, wherein
the semiconductor device further includes a constant-voltage power supply circuit with an output voltage thereof controlled by the output signal; and
an output voltage of the constant-voltage power supply circuit is feedback-connected to the other of the differential inputs, as the input signal.

(Twelfth Mode)
The semiconductor device as set forth in the eighth mode, wherein
the semiconductor device comprises:
first and second differential circuits each of which comprises the differential circuit;
the first to fourth power supply circuits provided corresponding to the first differential circuit, supply/stop of the power to the first differential circuit by each of the first to fourth power supply circuits being controlled by a first activation control signal that is the activation control signal for the first differential circuit;
the first to fourth power supply circuits provided corresponding to the second differential circuit, supply/stop of the power to the second differential circuit by each of the first to fourth power supply circuits being controlled by a second activation control signal that is the activation control signal for the second differential circuit; and
a constant-voltage power supply circuit with an output voltage thereof controlled by the second differential circuit, the output voltage being feedback-connected to the other of the differential inputs of the second differential circuit as the input signal; and
an external input signal received from an external connection terminal is connected to the first differential circuit as the input signal, and when the first activation control signal is at the active level, the first differential circuit compares a voltage level of the external input signal with the reference voltage and then outputs a result of the comparison as the output signal.

(Thirteenth Mode)
The semiconductor device as set forth in the twelfth mode, wherein
the first differential circuit further comprises:
a second differential pair connected to the first and second power supply circuits corresponding to the second differential pair, the reference voltage being supplied to one of differential inputs of the second differential pair and the external input signal being connected to the other of the differential inputs; and
a second load circuit connected between the second differential pair and the third and fourth power supply circuits; and
a pair of connecting points between the second differential pair and the second load circuit is also connected to each of the first differential pair and the first load circuit.

(Fourteenth Mode)
The semiconductor device as set forth in the ninth mode, the eleventh mode or the twelfth mode, comprising:
a plurality of the external connection terminals; and
a plurality of the differential circuits respectively provided corresponding to the plurality of the external connection terminals.

(Fifteenth Mode)
The semiconductor device as set forth in any one of the twelfth to fourteenth modes, wherein
the semiconductor device is a synchronous type semiconductor memory device, the external terminal is an address/command input terminal, and the constant-voltage power supply circuit is a constant-voltage power supply circuit for an internal circuit of the semiconductor device.

(Sixteenth Mode)
A production method of a semiconductor device comprising a differential circuit, comprising:
testing whether or not current consumption of the semiconductor device before burn-in varies to be large and recording the variation of the current consumption of the semiconductor device to be large when the current consumption varies to be large; and
performing the burn-in by limiting current to be flown to the differential circuit when the record is referred to and then it is confirmed that the current consumption of the semiconductor device varies to be large.

(Seventeenth Mode)
The production method of a semiconductor device as set forth in the sixteenth mode, wherein
the semiconductor device further comprises a non-volatile memory, and when the recording is performed, the variation of the current consumption of the semiconductor device to be large is recorded in the non-volatile memory in a test process of the semiconductor device; and
when performing the burn-in, the record is referred to by reading content of the non-volatile memory.

(Eighteenth Mode)
The production method of a semiconductor device as set forth in the seventeenth mode, wherein
the non-volatile memory is a fuse, and the fuse is cut when the current consumption of the semiconductor device varies to be large in the test process of the semiconductor device; and
when performing the burn-in, the record is referred to by reading a state of the fuse.

(Nineteenth Mode)
The production method of a semiconductor device as set forth in any one of the sixteenth to eighteenth mode, wherein
the semiconductor further comprises a ring oscillator; and
when the recording is performed, an oscillation cycle of the ring oscillator is tested, and it is determined that the current consumption of the semiconductor device varies to be large when the oscillation cycle of the ring oscillator varies to be rapid.

(Twentieth Mode)
The production method of a semiconductor device as set forth in to any one of the sixteenth to nineteenth modes, wherein
the semiconductor device is the semiconductor device as set forth in any one of the first to fifteenth modes.

(Twenty-First Mode)
A semiconductor device comprising:
a differential circuit; and
a power supply circuit that provides a power supply to the differential circuit;

current to be supplied to the differential circuit being controlled by the power supply circuit based on logics of a burn-in mode signal and an activation control signal of the differential circuit;

the differential circuit being a differential-type input circuit that receives an external input signal received from an external connection terminal and a reference voltage signal as differential input signals, compares a voltage level of the external input signal with the reference voltage when the activation control signal is at an active level, and outputs a result of the comparison as an output signal;

the semiconductor device further comprising:
an input circuit of a ratio type that receives the external input signal; and
an output selection circuit that selects an output signal of the input circuit of the ratio type or an output signal of the differential type input circuit, for output;
the burn-in mode signal controlling an operation of the input circuit of the ratio type and selection of the output selection circuit in such a manner that when the output selection circuit selects the output signal of the input circuit of the ratio type, the current to be supplied to the differential circuit by the power supply circuit is stopped.

(Twenty-Second Mode)
A semiconductor device comprising:
a differential type input circuit that compares an external input signal and a reference voltage to output a result of the comparison to an inside of the semiconductor device; and
a test circuit including an input circuit of a ratio type that outputs the external input signal to the inside of the semiconductor device at a time of a test in place of the differential type input circuit, the test circuit stopping power supply to the differential type input circuit during the test;
the test circuit further including:
an output selection circuit that activates an operation of the input circuit of the ratio type by a burn-in mode signal, and selects an output signal of the input circuit of the ratio type instead of an output signal of the differential type input circuit, for output.

(Twenty-Third Mode)
The semiconductor device as set forth in the twenty-second mode, further comprising:
a power supply circuit that provides a power supply to the differential type input circuit;
current to be supplied to the differential type input circuit by the power supply circuit being controlled, based on logics of the burn-in mode signal and an activation control signal of the differential type input circuit;
the test circuit activating the burn-in mode signal at the time of the test and controlling to stop the power supply to the differential type input circuit by the power supply circuit.

(Twenty-Fourth Mode)
The semiconductor device as set forth in the twenty-first mode or the twenty-third mode, wherein
the output selection circuit includes:
a first clocked gate that is activated to output the output signal of the input circuit of the ratio type when the burn-in mode signal is active; and
a second clocked gate that is activated to output the output signal of the differential type input circuit when the burn-in mode signal is inactive.

(Twenty-Fifth Mode)
The semiconductor device as set forth in any one of the twenty-first to twenty-fourth modes, further comprising:
a synchronous memory that operates in synchronization with a clock signal supplied from an outside;
the external input signal being a command signal for the synchronous memory, and the command signal to be output to the inside of the semiconductor device being fixed to be inactive when the burn-in mode signal is inactive and the activation control signal is inactive.

The initial description (including the claims, the specification, and the drawings) of the preceding application that provides a basis for the priority claims based on the Japanese patent applications should be deemed to be applied based on the filing date of the preceding application as the date of priority (date of reference), should not be deemed to be influenced by the added description of the present application, and should be deemed not to contain the added description.

Modifications and adjustments of the exemplary embodiments and an example are possible within the scope of the overall disclosure (including claims and drawings) of the present invention, and based on the basic technical concept of the invention. Various combinations and selections of various disclosed elements (including each element of each claim, each element of each example, and each element in each drawing) are possible within the scope of the claims of the present invention. That is, the present invention of course includes various variations and modifications that could be made by those skilled in the art according to the overall disclosure including the claims and the drawings and the technical concept.

What is claimed is:

1. A semiconductor device comprising:
a differential circuit;
a power supply circuit that provides a power supply to the differential circuit; wherein
current to be supplied to the differential circuit by the power supply circuit is controlled, based on logics of a burn-in mode signal and an activation control signal of the differential circuit,
the differential circuit comprises a differential type input circuit that receives an external input signal received from an external connection terminal and a reference voltage signal as differential input signals, compares a voltage level of the external input signal with a voltage level of the reference voltage signal when the activation control signal is at an active level, and outputs a result of the comparison as an output signal;
a first differential pair comprising transistors of a first conductivity type, the external input signal being supplied to one of the transistors and the reference voltage being supplied to the other of the transistors;
a first load circuit that becomes a load for the first differential pair;
a second differential pair comprising transistors of a second conductivity type, the external input signal being supplied to one of the transistors and the reference voltage being supplied to the other of the transistors; and
a second load circuit that becomes a load for the second differential pair.

2. The semiconductor device according to claim 1, further comprising:
an input circuit that receives the external input signal; and
an output selection circuit that selects an output signal of the input circuit or an output signal of the differential type input circuit, for output; the current to be supplied to the differential circuit by the power supply circuit being stopped when the output selection circuit selects the output signal of the input circuit.

3. The semiconductor device according to claim 2, wherein the output selection circuit selects the output signal of the input circuit when the burn-in mode signal is active.

4. The semiconductor device according to claim 1, wherein when the burn-in mode signal is active or when the activation control signal is inactive, the current to be supplied to the differential type input circuit by the power supply circuit is stopped.

5. The semiconductor device according to claim 1, wherein when the burn-in mode signal is inactive and when the activation control signal is active, the power supply circuit is controlled to supply the current to the differential type input circuit.

6. The semiconductor device according to claim 1, wherein the power supply circuit provides the power supply to the differential circuit when the activation control signal is at an active level, and the power supply circuit stops the power supply to the differential circuit when the activation control signal is at an inactive level.

7. The semiconductor device according to claim 1, further comprising:
a current limitation circuit that receives the burn-in mode signal and a first control signal to generate a current control signal for limiting the current to be supplied to the differential circuit by the power supply circuit when the burn-in mode signal and the first control signal are both active.

8. The semiconductor device according to claim 7, wherein the power supply circuit provides the power supply to the differential circuit when the activation control signal is at an active level, and the power supply circuit stops the power supply to the differential circuit when the activation control signal is at an inactive level.

9. The semiconductor device according to claim 8, wherein the power supply circuit comprises:
a first power supply circuit that supplies power to the differential circuit when the activation control signal is active, and stops supply of the power to the differential circuit when the activation control signal is inactive, irrespective of a logic level of a current limitation signal; and
a second power supply circuit that supplies power to the differential circuit when a current limitation signal is inactive and the activation control signal is active, and stops supply of the power to the differential circuit when a current limitation signal is active or the activation control signal is inactive.

10. The semiconductor device according to claim 8, wherein
the power supply circuit comprises:
first and second power supply circuits coupled to a first power source; and
third and fourth power supply circuits coupled to a second power source;
the first power supply circuit supplies power to the differential circuit from the first power source when the activation control signal is active, and stops supply of the power to the differential circuit when the activation control signal is inactive, irrespective of a logic level of a current limitation signal;
the second power supply circuit supplies power to the differential circuit from the first power source, in parallel with the first power supply circuit, when a current limitation signal is inactive and the activation control signal is active, and stops supply of the power to the differential circuit when a current limitation signal is active or the activation control signal is inactive;
the third power supply circuit supplies power to the differential circuit from the second power source when the activation control signal is active, and stops supply of the power to the differential circuit when the activation control signal is inactive, irrespective of the logic level of a current limitation signal; and
the fourth power supply circuit supplies power to the differential circuit from the second power source, in parallel with the third power supply circuit, when a current limitation signal is inactive and the activation control signal is active, and stops supply of the power to the differential circuit when a current limitation signal is active or the activation control signal is inactive.

11. The semiconductor device according to claim 10, wherein
the semiconductor device further includes a non-volatile memory and a reading circuit for the non-voltage memory; and
the current limitation circuit comprises:
a first combinational logic circuit that combines a logic of the non-volatile memory read by the reading circuit and a test mode signal to generate the first control signal; and
a second combinational logic circuit that generates the current limitation signal from the first control signal and the burn-in mode signal.

12. The semiconductor device according to claim 10, wherein
the current limitation circuit includes a third combinational logic circuit that combines a current limitation signal and the activation control signal to control turning on/off of the second and fourth power supply circuits;
each of the first and third power supply circuits comprises a power supply transistor that is controlled to be turned on/off by the activation control signal; and
each of the second and fourth power supply circuits comprises a power supply transistor that is controlled to be turned on/off by an output of the third combinational logic circuit.

13. The semiconductor device according to claim 10, wherein
each of the first and third power supply circuits comprises a power supply transistor that is controlled to be turned on/off by the activation control signal; and
each of the second and fourth power supply circuits comprises a first power supply transistor that is controlled to be turned on/off by the activation control signal and a second power supply transistor having a current path thereof coupled in series with the first power supply transistor, the second power supply transistor being controlled to be turned on/off by a current limitation signal, power being supplied to the differential circuit from each of the first and second power sources when the first and second power supply transistors are both controlled to be turned on.

14. The semiconductor device according to claim 10, wherein
the differential circuit comprises:
a first differential pair connected to the third and fourth power supply circuits, a reference voltage being supplied to one of differential inputs of the first differential pair and an input signal being connected to the other of the differential inputs; and
a first load circuit connected between the first differential pair and the first and second power supply circuits; and an output signal is taken out from a connecting point between the first differential pair and the first load circuit.

15. The semiconductor device according to claim 14, wherein
the differential circuit comprises:
a second differential pair connected to the first and second power supply circuits, the reference voltage being supplied to one of differential inputs of the second differential pair and the input signal being connected to the other of the differential inputs; and
a second load circuit connected between the second differential pair and the third and fourth power supply circuits; and
a pair of connecting points between the second differential pair and the second load circuit is also connected to each of the first differential pair and the first load circuit.

16. The semiconductor device according to claim 15, wherein
an external input signal received from an external connection terminal is connected to the differential circuit as the input signal, and the differential circuit compares a voltage level of the external input signal with the reference voltage when the activation control signal is at the active level, and then outputs a result of the comparison as the output signal.

17. The semiconductor device according to claim 15, comprising:
a plurality of the external connection terminals; and
a plurality of the differential circuits respectively provided corresponding to the plurality of the external connection terminals.

18. The semiconductor device according to claim 14, wherein
the semiconductor device further includes a constant-voltage power supply circuit with an output voltage thereof controlled by the output signal; and
an output voltage of the constant-voltage power supply circuit is feedback-connected to the other of the differential inputs, as the input signal.

19. The semiconductor device according to claim 14, wherein
the semiconductor device comprises:
first and second differential circuits each of which comprises the differential circuit;
the first to fourth power supply circuits provided corresponding to the first differential circuit, supply/stop of the power to the first differential circuit by each of the first to fourth power supply circuits being controlled by a first activation control signal that is the activation control signal for the first differential circuit;
the first to fourth power supply circuits provided corresponding to the second differential circuit, supply/stop of the power to the second differential circuit by each of the first to fourth power supply circuits being controlled by a second activation control signal that is the activation control signal for the second differential circuit; and
a constant-voltage power supply circuit with an output voltage thereof controlled by the second differential circuit, the output voltage being feedback-connected to the other of the differential inputs of the second differential circuit as the input signal; and
an external input signal received from an external connection terminal is connected to the first differential circuit as the input signal, and when the first activation control signal is at the active level, the first differential circuit compares a voltage level of the external input signal with the reference voltage and then outputs a result of the comparison as the output signal.

20. The semiconductor device according to claim 19, wherein
the first differential circuit further comprises:
a second differential pair connected to the first and second power supply circuits corresponding to the second differential pair, the reference voltage being supplied to one of differential inputs of the second differential pair and the external input signal being connected to the other of the differential inputs; and
a second load circuit connected between the second differential pair and the third and fourth power supply circuits; and
a pair of connecting points between the second differential pair and the second load circuit is also connected to each of the first differential pair and the first load circuit.

21. The semiconductor device according to claim 19, wherein
the semiconductor device is a synchronous type semiconductor memory device, the external terminal is an address/command input terminal, and the constant-voltage power supply circuit is a constant-voltage power supply circuit for an internal circuit of the semiconductor device.

22. A semiconductor chip comprising:
a differential circuit including a first input node coupled to an external input terminal receiving an input signal outside of the semiconductor chip and a second input node receiving a reference voltage; and
a control circuit coupled between the differential circuit and a power supply line whether providing a power supply voltage to the differential circuit to activate the differential circuit or suspending to provide the power supply voltage to the differential circuit to deactivate the differential circuit in response to a burn-in mode signal indicating a burn-in test mode or not.

23. The semiconductor chip according to claim 22, further comprising a voltage generating circuit that generates the reference voltage based on an external power supply voltage supplied to an external power supply voltage terminal.

24. The semiconductor chip according to claim 22, further comprising an input circuit that couples between the input terminal and an output terminal coupled to an output node of the differential circuit.

25. The semiconductor chip according to claim 24, wherein the input circuit is activated when the burn-in mode signal indicates the burn-in test mode to create bypass between the input terminal and the output terminal without passing the differential circuit.

* * * * *